United States Patent
Catthoor et al.

(10) Patent No.: US 10,651,787 B2
(45) Date of Patent: May 12, 2020

(54) RECONFIGURABLE PHOTOVOLTAIC MODULE

(71) Applicant: IMEC VZW, Leuven (BE)

(72) Inventors: Francky Catthoor, Teme (BE); Maria-Iro Baka, Pallini Athens (GR)

(73) Assignee: IMEC VZW, Leuven (BE)

( * ) Notice: Subject to any disclaimer, the term of this patent is extended or adjusted under 35 U.S.C. 154(b) by 571 days.

(21) Appl. No.: 15/247,257

(22) Filed: Aug. 25, 2016

(65) Prior Publication Data

US 2017/0077869 A1    Mar. 16, 2017

(30) Foreign Application Priority Data

Sep. 12, 2015 (EP) ...................................... 15184967

(51) Int. Cl.
  *H02S 40/36*    (2014.01)
  *H01L 31/02*    (2006.01)
  *H02J 3/38*    (2006.01)

(52) U.S. Cl.
  CPC ........ *H02S 40/36* (2014.12); *H01L 31/02021* (2013.01); *H02J 3/385* (2013.01); *Y02E 10/50* (2013.01)

(58) Field of Classification Search
  CPC ... H01L 31/02021; H02S 40/36; Y02E 10/50; H02J 3/385
  See application file for complete search history.

(56) References Cited

U.S. PATENT DOCUMENTS

| | | | | |
|---|---|---|---|---|
| 9,728,965 B2 * | 8/2017 | Geil | .......................... | H02J 3/14 |
| 9,819,182 B1 * | 11/2017 | Batten | ........................ | H02J 1/08 |
| 2001/0023703 A1 * | 9/2001 | Kondo | .............. | H01L 31/02021 |
| | | | | 136/244 |
| 2008/0135084 A1 | 6/2008 | Scharlack | | |

(Continued)

FOREIGN PATENT DOCUMENTS

| EP | 2587334 A1 * | 5/2013 | ....... H01L 31/02021 |
|---|---|---|---|
| EP | 2771753 A2 | 9/2014 | |

(Continued)

OTHER PUBLICATIONS

Falvo, "Safety issues in PV systems: Design choices for a secure fault detection and for preventing fire risk," Case Studies in Fire Safety vol. 3, May 2015, pp. 1-16 (Year: 2015).*

(Continued)

*Primary Examiner* — Pinping Sun
(74) *Attorney, Agent, or Firm* — McDonnell Boehnen Hulbert & Berghoff LLP

(57) ABSTRACT

The present disclosure relates to reconfigurable voltaic modules. One example embodiment includes a photovoltaic module. The photovoltaic module includes a plurality of photovoltaic cells arranged in a grid having logical rows and columns. The photovoltaic module also includes a plurality of non-reconfigurable interconnects electrically interconnecting subsets of the plurality of photovoltaic cells to form a plurality of cell strings. In addition, the photovoltaic module includes a plurality of reconfigurable interconnects. Each cell string includes at least four photovoltaic cells connected in an electrical series from a first cell to a last cell, the first cell and the last cell being located on a same edge of the grid.

17 Claims, 8 Drawing Sheets

(56) References Cited

U.S. PATENT DOCUMENTS

| | | | |
|---|---|---|---|
| 2008/0142071 A1* | 6/2008 | Dorn | H05K 1/0293 136/245 |
| 2009/0079412 A1 | 3/2009 | Kuo | |
| 2011/0031816 A1* | 2/2011 | Buthker | H01L 31/02021 307/82 |
| 2011/0138609 A1* | 6/2011 | Cherukupalli | H01L 31/02021 29/592.1 |
| 2011/0144822 A1* | 6/2011 | Choi | H02J 3/32 700/297 |
| 2011/0203635 A1* | 8/2011 | Beck | H01L 31/02021 136/244 |
| 2011/0266876 A1* | 11/2011 | Lauinger | H02J 1/00 307/71 |
| 2011/0290986 A1* | 12/2011 | Yon | G01J 5/20 250/208.2 |
| 2012/0068547 A1 | 3/2012 | Vermeersch et al. | |
| 2012/0112557 A1* | 5/2012 | Sager | H01L 31/02021 307/112 |
| 2012/0160297 A1* | 6/2012 | Yamakawa | H01L 31/02021 136/244 |
| 2012/0313455 A1* | 12/2012 | Latham | H01L 31/02021 307/117 |
| 2013/0106194 A1* | 5/2013 | Jergovic | H01L 31/0504 307/77 |
| 2014/0060616 A1* | 3/2014 | Okandan | B64G 1/443 136/244 |
| 2014/0253138 A1* | 9/2014 | Ishii | H02H 3/16 324/509 |
| 2014/0312700 A1 | 10/2014 | Catthoor et al. | |
| 2016/0087579 A1* | 3/2016 | Moslehi | H01L 31/0516 136/251 |
| 2016/0308488 A1* | 10/2016 | Liu | H02S 20/32 |
| 2018/0097360 A1* | 4/2018 | Batten | H02J 1/08 |
| 2018/0212440 A1* | 7/2018 | Depond | H02J 3/28 |
| 2018/0254366 A1* | 9/2018 | Vatelmacher | H01F 27/28 |

FOREIGN PATENT DOCUMENTS

| | | |
|---|---|---|
| JP | 2015012116 A | 1/2015 |
| WO | 2008/076301 A1 | 6/2008 |
| WO | 2013/060564 A2 | 5/2013 |
| WO | WO-2015106170 A2 * | 7/2015 ......... H01L 31/0504 |

OTHER PUBLICATIONS

European Search Report, European Patent Application No. 15184967.6, dated Jan. 25, 2016, 10 pages.

Anagnostos, D. et al., "Presentation of a Verilog-AMS Model for Detailed Transient Electro-Thermal Simulations of PV Modules and Systems", 29th European Photovoltaic Solar Energy Conference and Exhibition, 2014, 5 pages.

* cited by examiner

RECONFIGURABLE PHOTOVOLTAIC MODULE

CROSS-REFERENCE TO RELATED APPLICATIONS

The present application is a non-provisional patent application claiming priority to European Patent Application No. EP 15184967.6, filed Sep. 12, 2015, the contents of which are hereby incorporated by reference.

FIELD OF THE DISCLOSURE

The disclosure relates to the field of photovoltaic energy collection. More specifically it relates to a photovoltaic module, a photovoltaic system and a method for operating such photovoltaic module.

BACKGROUND

Photovoltaic panels can be used for on-site, clean energy production. It is known in the art to connect modules in series to form module-level strings, which are in turn connected in parallel forming a photovoltaic (PV) array, e.g. such as used in commercial photovoltaic installations. A photovoltaic system thus uses many interconnected solar cells to convert sunlight into electricity. The photovoltaic system may comprise other components, such as mechanical and/or electrical connectors and mountings, voltage regulators, other means for modifying or modulating the electrical output, and tracking means for adjusting the orientation with respect to the sun. The array may for example be connected to an inverter, e.g. equipped with a Maximum Power Point Tracker (MPPT) to maximize the generated power. Even though such a PV system may, for example, operate under uniform lighting conditions, various conditions and/or varying conditions encountered in practice may lead to mismatch effects in the PV array.

Partial shading of the PV system can occur due to static objects, such as for example trees or chimneys, or due to dynamic shading conditions, e.g. due to clouds or soiling of the panel surface. Furthermore, incident shade can be caused by unpredictable events such as moving vehicles or objects, e.g. birds or leaves, and cloud covers. The direction, shape and density profile of such shadows is unpredictable, even though a temporal and spatial partial correlation may exist. It is known in the art that unpredictable shading events may temporarily cause strong differences between cells.

When the PV system is illuminated in a non-uniform manner, significant power losses are observed. This power loss is not necessarily linearly related to the casted shade, e.g. to the shadow area and/or shadow density. For example, the operation of cells which are not obscured, e.g. fully illuminated cells, can be affected by the shadow as well, for example due to a serial connection to another cell which is at least partially shaded. Furthermore, local hot-spots may threaten the proper operation of the system and may even cause permanent damage.

Several approaches can be used to deal with stochastic shading: (i) bypassing, (ii) global MPPT, (iii) decentralized MPPT, (iv) parallel solutions and (v) interconnection topology optimizations. Note that, ideally, in comparing the strengths of such techniques, other factors than power production should also be taken into account, such as installation cost and complexity.

In the bypassing approach, diodes are placed across groups of cells for isolation of the heavily shaded cells, such that the current bypasses them completely, e.g. bypass diodes may be placed over groups of cells to pass an excess current in order to prevent damage. Although this approach has its disadvantages, mismatch due to stochastic effects is handled in an elegant, but unfortunately also potentially suboptimal, manner. Under non-uniform operating conditions, the presence of bypass diodes affects the curve of the IV output of the array by creating local maxima. Depending on the previous operation point, e.g. the choice of operating voltage, an MPPT algorithm may not be able to detect efficiently the GMPP.

Global MPPT (GMPPT) refers to a class of techniques that aim to find the global maximum in the P-V curve of the array among multiple local maxima, e.g. in a centralized converter setup. Even though GMPPT can outperform traditional MPPT techniques, it still cannot harvest all available power because some cells are bypassed and/or a lower current is forced on the rest of the array. These losses can be shown to be non-negligible under typical dynamic shading conditions.

The third class of techniques mentioned above is decentralized MPPT. In such decentralized MPPT, each part of the system can operate at its local MPP. Different levels of control distribution can be used, such as MPPT at the level of an array, string, module, bypassed section or cell. Generally, a finer-grain MPPT can be advantageous for power harvesting.

The fourth class of solutions, referred to as parallel solutions hereinabove, provide a way to restore symmetry in a shaded panel by storing and then distributing energy to shaded cells. The power output increase from using battery-type solutions can be significant, but the control scheme that is used is complex, the extra hardware components imply an additional cost, and this type of approach does not provide easy reconfiguration.

The fifth class of approaches that can be used deal with stochastic shading by combining an even finer grained MPPT with improved interconnection topologies, either at the cell level inside the module or at the PV array level among panels. In such approaches, cells or panels are grouped together based on similar characteristics and controlled with dedicated MPPTs.

At the PV array level, a dynamic electrical array reconfiguration (EAR) strategy can be used that acts on the photovoltaic generator of a grid-connected PV system, based on a plant-oriented configuration, to improve the energy production when the operating conditions of the solar panels are different. A controllable switching matrix between the PV generator and the central inverter allows the electrical reconnection of the available PV modules. Furthermore, it is known that a change in the interconnections among the modules within a shaded PV field can impact its MPP. Several interconnection schemes have been favored based on the shaded pattern.

Where partial shading can be dealt with on a PV array level, as in some alternate approaches mentioned hereinabove, a per-panel reconfiguration of the cell interconnections might provide a finer-grain control and could be promising to extract an even higher amount of energy, e.g. close to the maximum possible energy, from the shaded cells.

The concept of having multiple converters per module, each connected to a group of similar solar cells, is introduced in US 2008/0135084. This arrangement enables efficient MPP tracking and maximum power harvesting. However, no details are disclosed on the implementation of the cell interconnection, except that both series and parallel connection schemes could be used for improved results.

In WO 2008/076301, an architecture for configuring cell interconnections is disclosed. In this architecture, a fully regular and uniform fine-grained grid-like interconnection network is arranged between the cells of a panel, allowing to interconnect cells in any sequence and any configuration, e.g. series or parallel. The configuration of the network can be performed at manufacturing time, or at in-the-field operation if switches and a controller are provided.

However, the configurations disclosed by the patent references cited hereinabove may entail a high implementation cost, due to the uniform and highly fine-grained application.

EP 2771753 discloses a module having a reconfigurable arrangement of photovoltaic cells, which are connectable to at least one DC-DC converter. The cells are non-divisibly joined in series, in substrings of at least two cells. The arrangement has an initial topology and a run-time topology, which are both non-uniform. The arrangement further comprises a means to reconfigure the arrangement at run-time by forming parallel and/or series and/or hybrid connections of the substrings, in which not all parallel or series connections are reachable by the reconfigurable arrangement. The reconfigurable arrangement is responsive to a non-uniform photonic stimulation by a non-uniform re-arrangement of the substrings. The cell-strings may comprise the columns or rows of the module, thus providing responsive adaptability of the module in one direction. Furthermore, a vertical split, e.g. in the direction corresponding to the orientation of the substrings, may be applied to allow some flexibility of the reconfiguration in two directions.

However, this bi-directional reconfiguration may have a cost associated therewith. For example, the vertical split may use switches inside the module, which can increase the cost significantly.

SUMMARY

It is an object of some embodiments to provide good and efficient configurations of photovoltaic cells and modules.

In some embodiments, smart photovoltaic module topologies may be used to efficiently achieve a good energy yield under non-uniform shading and/or lighting conditions.

In some embodiments, a highly non-uniform topology may be provided for a photovoltaic cell arrangement while maintaining many of the benefits of dynamic intra-module cell grouping.

In some embodiments, configurable modules can be provided, e.g. having controllable intra-module switches allowing distributed control inside modules.

In some embodiments, configurable modules can be provided for providing distributed control inside modules, as well as both in PV module context and between modules in a PV panel and/or system.

In some embodiments, good maximum power harvesting capabilities may be provided with a low component cost overhead.

The above objective is accomplished by a method and device according to various embodiments.

Some embodiments relate to a photovoltaic module comprising a plurality of photovoltaic cells arranged in a grid having logical rows and columns; a plurality of non-reconfigurable interconnects electrically interconnecting subsets of the plurality of photovoltaic cells to form a plurality of cell strings; and a plurality of reconfigurable interconnects;

wherein each cell string comprises at least four photovoltaic cells connected in an electrical series from a first cell to a last cell, the first cell and the last cell being located on the same edge of the grid, wherein the last cell is adjacent to a first cell of an adjacent cell string and/or the first cell is adjacent to a last cell of an adjacent cell string, wherein the plurality of reconfigurable interconnects is adapted for electrically interconnecting the plurality of cell strings such that a global photovoltaic string consisting of an electrical series connecting the plurality of cell strings can be controllably established, wherein the plurality of reconfigurable interconnects is furthermore adapted for controllably connecting adjacent cell strings electrically in parallel, thereby establishing at least one parallel electrical circuit having parallel circuit legs formed by at least two adjacent cell strings, wherein the photovoltaic module is furthermore adapted for connecting the plurality of cell strings to at least one DC-DC converter for providing an output electrical power over an output line, and wherein the plurality of reconfigurable interconnects is adapted for receiving at least one control signal from at least one controller for forming, when in operation, parallel, serial and/or hybrid connections of the plurality of cell strings to cluster matching photovoltaic cells in response to a non-uniform photonic stimulation.

The photovoltaic module may comprise the at least one DC-DC converter electrically connected to the plurality of cell strings via the plurality of reconfigurable interconnects.

The at least one DC-DC converter may comprise a plurality of DC-DC converters and the plurality of reconfigurable interconnects may comprise at least one switch located between the DC-DC converters for dynamically selecting, in operation, the number of DC-DC converters to be actively used.

The plurality of DC-DC converters may comprise at least two DC-DC converters interconnected in a voltage increment configuration and/or at least two DC-DC converters interconnected in a current accumulation configuration.

The plurality of DC-DC converters may comprise at least two DC-DC converters interconnected in a parallel configuration.

The photovoltaic module may comprise a further DC-DC converter, wherein a joined output of the at least two DC-DC converters is connected as input to the further DC-DC converter.

The photovoltaic module may comprise the at least one controller for controlling the plurality of reconfigurable interconnects such as to form, when in operation, parallel, serial and/or hybrid connections of the plurality of cell strings to cluster matching photovoltaic cells in response to a non-uniform photonic stimulation by optimizing at least one of current, voltage, frequency or power provided by the at least one DC/DC converter over the output line.

For some or all cell strings of the plurality of cell strings that interconnects a first subset of photovoltaic cells, a corresponding mirrored cell string may exist in the plurality of cell strings that interconnects a second subset of photovoltaic cells, wherein the second subset is obtained by a point mirror projection of the first subset with respect to a geometrical center of the grid.

The plurality of cell strings may comprise U-shaped cell strings.

Each U-shaped cell string may correspond to a pair of adjacent logical columns and a half with respect to the number of logical rows, such that any photovoltaic cell interconnected by the U-shaped cell string has a column index corresponding to either one of the pair of adjacent logical columns and a row index corresponding to a row in the half.

The plurality of cell strings may forms a partition of the plurality of photovoltaic cells, and the plurality of cell strings may consist of the U-shaped cell strings.

The plurality of cell strings may form a partition of the plurality of photovoltaic cells, and the plurality of cell strings may consist of the U-shaped cell strings and at least one linear edge cell string, the linear edge cell string interconnecting only photovoltaic cells located in either the first column or the last column of the grid.

The plurality of cell strings may consists of a first plurality of U-shaped cell strings, a second plurality of U-shaped cell strings, a first linear edge cell string and a second linear edge cell string, wherein each U-shaped cell string of the first plurality interconnects only cells located in the first half of rows of the grid, wherein each U-shaped cell string of the second plurality interconnects only cells located in the second half of rows of the grid, wherein the first linear edge cell string interconnects only photovoltaic cells of the first column of the grid, and wherein the second linear edge cell string interconnecting only photovoltaic cells of the last column of the grid.

The plurality of reconfigurable interconnects may comprise at least one switch (Ai) having a first terminal electrically connected to the last cell of a corresponding cell string and a second terminal electrically connected to the first cell of another cell string, the first cell of the other cell string being adjacent to the last cell of the corresponding cell string.

The plurality of reconfigurable interconnects may comprise at least one switch (Bi) having a first terminal electrically connected to the last cell of a corresponding cell string and a second terminal electrically connected to the last cell of another cell string, in which the first cell of the other cell string is adjacent to the last cell of the corresponding cell string.

The plurality of reconfigurable interconnects may comprise at least one switch having a first terminal electrically connected to a corresponding cell string and a second terminal for electrically connecting to the at least one DC-DC converter when in operation.

Some embodiments furthermore relate to a photovoltaic system comprising a plurality of photovoltaic modules in accordance with any of the previous claims, and the at least one controller for controlling the plurality of photovoltaic modules.

Some embodiments relate to a method for operating a photovoltaic module, the method comprising obtaining a photovoltaic module comprising a plurality of photovoltaic cells, arranged in a grid having logical rows and columns, and a plurality of non-reconfigurable interconnects electrically interconnecting subsets of the plurality of photovoltaic cells to form a plurality of cell strings, wherein each cell string comprises at least four photovoltaic cells connected in an electrical series from a first cell to a last cell, the first cell and the last cell being located on the same edge of the grid, and wherein the last cell is adjacent to a first cell of an adjacent cell string and/or the first cell is adjacent to a last cell of an adjacent cell string;

determining whether the photovoltaic module is subject to a non-uniform photonic stimulation, controlling a plurality of reconfigurable interconnects of the photovoltaic module to electrically interconnect the plurality of cell strings such that a global photovoltaic string consisting of an electrical series connecting the plurality of cell strings is established and connected to a DC-DC converter when the photovoltaic module is determined to be subject to a substantially uniform photonic stimulation; and controlling the plurality of reconfigurable interconnects to establish at least one parallel electrical circuit having parallel circuit legs formed by at least two adjacent cell strings such as to cluster matching photovoltaic cell strings when the photovoltaic module is determined to be subject to substantially non-uniform photonic stimulation, wherein the steps of controlling the plurality of reconfigurable interconnects comprise sending at least one control signal from at least one controller to the plurality of reconfigurable interconnects.

The method may comprise determining a number of active DC-DC converters to connect in parallel to the plurality of cell strings, the number being determined taking the determined non-uniform photonic stimulation into account, and may comprise controlling the plurality of reconfigurable interconnects to establish a plurality of parallel electrical circuits, each parallel electrical circuit having parallel circuit legs formed by at least two adjacent cell strings, and to establish an electrical connection of each of the plurality of parallel electrical circuits to a corresponding active DC-DC converter.

Particular aspects of various embodiments are set out in the accompanying independent and dependent claims. Features from the dependent claims may be combined with features of the independent claims and with features of other dependent claims as appropriate and not merely as explicitly set out in the claims.

These and other aspects will be apparent from and elucidated with reference to the embodiment(s) described hereinafter.

Figure 1:
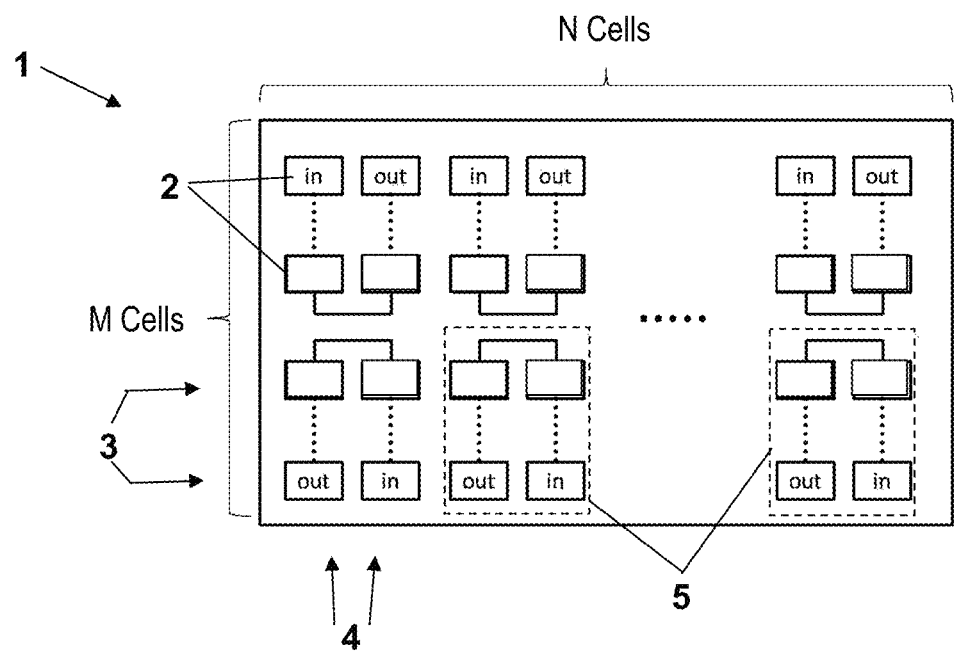
FIG. 1 illustrates a first example template architecture for a photovoltaic module, according to example embodiments.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION

Various embodiments will be described with reference to certain drawings but the embodiments are not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present embodiment, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claims requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of this disclosure, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

In a first aspect, the present disclosure relates to a photovoltaic module, e.g. a configurable photovoltaic module. The photovoltaic module comprises a plurality of photovoltaic cells arranged in a grid having logical rows and columns. The module also comprises a plurality of non-reconfigurable interconnects electrically interconnecting subsets of the plurality of photovoltaic cells to form a plurality of cell strings, and a plurality of reconfigurable interconnects. The non-reconfigurable interconnects may refer to static electrical interconnects, e.g. interconnects which are not responsive to a control signal, e.g. passive electrical interconnects, such as wires or passive conductors. The non-reconfigurable interconnects may particularly be non-reconfigurable during operation of the module.

This plurality of reconfigurable interconnects is adapted for electrically interconnecting the plurality of cell strings such that a global photovoltaic string consisting of an electrical series connection of the plurality of cell strings can be controllably established. The plurality of reconfigurable interconnects is furthermore adapted for controllably connecting adjacent cell strings electrically in parallel, thereby establishing at least one parallel electrical circuit having parallel circuit legs formed by at least two adjacent cell strings.

The photovoltaic module is furthermore adapted for connecting the plurality of cell strings to at least one DC-DC converter. For example, the photovoltaic module may comprise at least one DC-DC converter connected to the plurality of cell strings, e.g. via the reconfigurable interconnects.

The plurality of reconfigurable interconnects is adapted for receiving at least one control signal from at least one controller for forming, when in operation, parallel, serial and/or hybrid connections of the plurality of cell strings such as to cluster matching photovoltaic cells in response to a non-uniform photonic stimulation.

The module may for example comprise at least one controller for controlling the plurality of reconfigurable interconnects for forming, when in operation, parallel, serial and/or hybrid connections of the plurality of cell strings such as to cluster matching photovoltaic cells in response to a non-uniform photonic stimulation.

Furthermore, each cell string of the plurality of cell strings comprises at least four photovoltaic cells connected in an electrical series from a first cell to a last cell, in which the first cell and the last cell are located on the same edge of the grid. The last cell is furthermore adjacent to a first cell of an adjacent cell string of the plurality of cell strings and/or the first cell is adjacent to a last cell of an adjacent cell string of the plurality of cell strings.

In some embodiments, a configurable topology in a photovoltaic assembly may be provided that may, for example, significantly outperform a conventional grid array module comprising 10 by 6 cells under heavy shade.

FIG. 1 shows an example photovoltaic module 1 in accordance with embodiments. The architectural template of a module in accordance with embodiments may be adapted for enabling a dynamic reconfiguration of photovoltaic cell interconnections inside a single or among several modules. For example, a photovoltaic system may comprise a plurality of modules 1, interconnected in a series, parallel, hybrid, adaptive or cascaded manner. The photovoltaic module 1 may for example be a large area module, e.g. a mechanically flexible large area module, or a mechanically rigid large area module.

The photovoltaic module 1 comprises a plurality of photovoltaic cells 2 arranged in a grid having logical rows 3 and columns 4, e.g. M*N cells may be evenly distributed over M rows and N columns. Thus, the cells 2 may be arranged in an array of physically adjacent cells, in which the adjacency relation may be determined by a local neighborhood, of each cell that is interior with respect to the grid, comprising a cell from a previous row, a cell from a next row, a cell from a previous column and a cell from a next column. Logical rows and logical columns merely refer to the two complementary major axes of organization of such grid, and do not imply a physical orientation and/or other feature to distinguish a column from a row.

A trade-off may exist between the amount of generated power and the architecture complexity of a photovoltaic system. When additional power dissipation caused by additional elements is ignored, a fine-grained, cell-level, fully configurable architecture could be used for power generation. However, this might require a complex supporting network of wires and switches. On the other hand, a conventional module, having only permanently series-wired photovoltaic cells, may have a low manufacturing cost, but may perform poorly under partial shading. In order to recover more power than in such conventional setup under non-uniform irradiation conditions, a specific cell-string level architecture is disclosed herein below that balances the cost overhead and flexibility.

Figure 2:
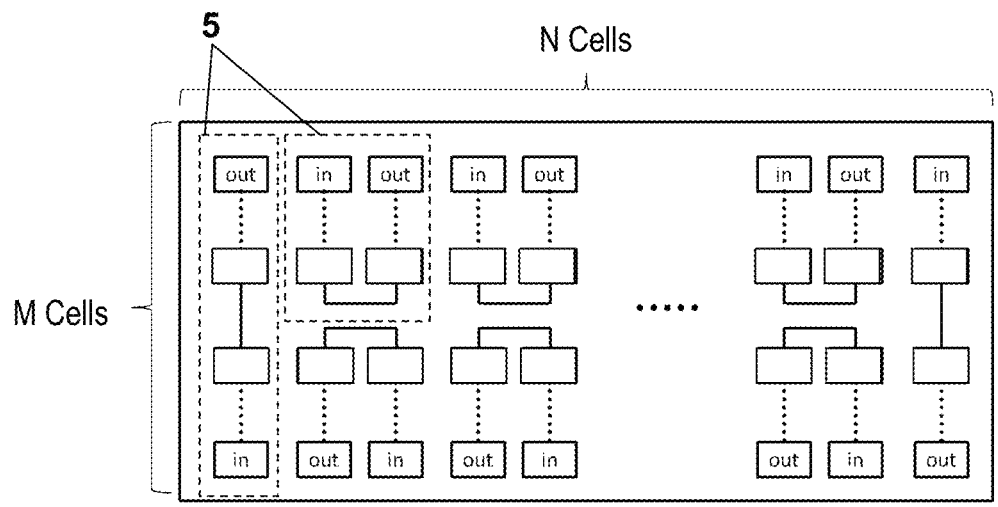
FIG. 2 illustrates a second example template architecture for a photovoltaic module, according to example embodiments.

Example topological divisions of the module in cell strings are shown in FIG. 1 and FIG. 2. The module in accordance with embodiments may be divided into cell strings of series-connected photovoltaic cells to reduce the overhead of component cost, as well as to reduce wiring, convertor and switching losses. A Pareto-optimal cell string size and arrangement of such cell strings in a module may be achieved by embodiments. Some embodiments provide a good trade-off can be achieved between architecture complexity and run-time flexibility.

The photovoltaic module 1 comprises a plurality of non-reconfigurable interconnects, e.g. wires, wiring or other passive electrically conductive connectors, that electrically interconnect subsets of the plurality of photovoltaic cells to form a plurality of cell strings 5. A cell string may for example correspond to a non-divisible electric power generating element while in normal operation, e.g. a power generating circuit that is non-configurable during operation, the cell string consists of a predetermined plurality of permanently connected photovoltaic cells in series.

Thus, the photovoltaic cells may be non-divisibly joined in series forming cell strings of at least four cells. Each interconnected subset may form a corresponding cell string. In embodiments, the number of photovoltaic cells connected in a series, forming a cell string, may be the same for each cell string.

Each cell string 5 comprises at least four photovoltaic cells connected in an electrical series from a first cell "in" to a last cell "out". The first cell may correspond to a low voltage terminal of the cell string, while the last cell may correspond to a high voltage terminal of the cell string. The first cell and the last cell are furthermore located on the same edge of the grid, e.g. on the same linear segment of the circumferential edge. For example, an edge may refer to either one of a first logical row, a last logical row, a first logical column and a last logical column of the grid having logical rows and columns. Furthermore, the first cell is adjacent to a last cell of an adjacent cell string of the plurality of cell strings.

Some or all of the cell string of the plurality of cell strings may have a corresponding mirrored cell string, e.g. a cell string interconnecting the set of photovoltaic cells, which set is obtained by the point mirror projection of the set of cells interconnected by the former cell string with respect to a geometrical center of the grid. Furthermore, this point mirror projection may preserve the designation of the first, respectively the last, cell of the string. Examples of such point-symmetrical partitions of the grid formed by the photovoltaic cells into cell strings are illustrated by the example architecture templates shown in FIG. 1 and FIG. 2. In these templates, U-shaped cell strings are used. For example, such U-shaped cell string may be configured by dividing the cells of the columns (or the rows) in half and connecting in series the two halves of two consecutive rows (or columns) respectively. This is illustrated in FIG. 1 and FIG. 2.

These example architecture templates for a module in accordance with embodiments allow flexibility of electrical network configuration in two directions, e.g. in a column direction in which a plurality of cell strings are arranged next to each other, and in a row direction in which two separately controllable cell strings are provided next to each other over a substantial area of the grid. The configuration allows a vertical reconfigurable split, e.g. in the elongate direction over which the U-shaped cell strings are arranged in these examples, e.g. in the column direction, without requiring switches inside the module. Such switching arranged in or on the interior of the grid would potentially increase the cost of the module significantly.

For example, as shown in FIG. 1, in some embodiments, the plurality of cell strings may form a partition of the plurality of photovoltaic cells, and the plurality of cell strings may consist exclusively of U-shaped cell strings, in which each U shaped cell string has an first cell "in" and a last cell "out", adjacent to each other, on the same edge of the grid, e.g. on the first or last row of the grid, or equivalently, on the first or last column of the grid.

Furthermore, the plurality of cell strings may consist exclusively of: a first plurality of U-shaped cell strings, in which each U shaped cell string has an first cell "in" and a last cell "out", adjacent to each other, on the first row of the grid, and a second plurality of U-shaped cell strings, in which each U-shaped cell string has a first cell "in" and a last cell "out", adjacent to each other, on the last row of the grid. Furthermore, each U-shaped cell string of the first plurality may consist of only cells located in the first half of rows of the grid, while each U-shaped cell string of the second plurality may consist of only cells located in the second half of rows of the grid.

As another example, shown in FIG. 2, in some embodiments, the plurality of cell strings may form a partition of the plurality of photovoltaic cells, and the plurality of cell strings may consist exclusively of U-shaped cell strings and at least one linear edge cell string. Each U shaped cell string has an first cell "in" and a last cell "out", adjacent to each other, on the first or last row of the grid. Each linear edge cell string has a first cell "in" and a last cell "out" on the same edge of the grid, being either the first column or the last column, and may consist exclusively of cells located in either the first column or the last column of the grid.

Furthermore, the plurality of cell strings may consist exclusively of: (a) a first plurality of U-shaped cell strings, in which each U shaped cell string has an first cell "in" and a last cell "out", adjacent to each other, on the first row of the grid, (b) a second plurality of U-shaped cell strings, in which each U-shaped cell string has a first cell "in" and a last cell "out", adjacent to each other, on the last row of the grid, (c) a first linear edge cell string consisting of the photovoltaic cells of the first column of the grid, and (d) a second linear edge cell string consisting of the photovoltaic cells of the last column of the grid. Furthermore, each U-shaped cell string of the first plurality may consist of only cells located in the first half of rows of the grid, while each U-shaped cell string of the second plurality may consist of only cells located in the second half of rows of the grid.

Figure 3:
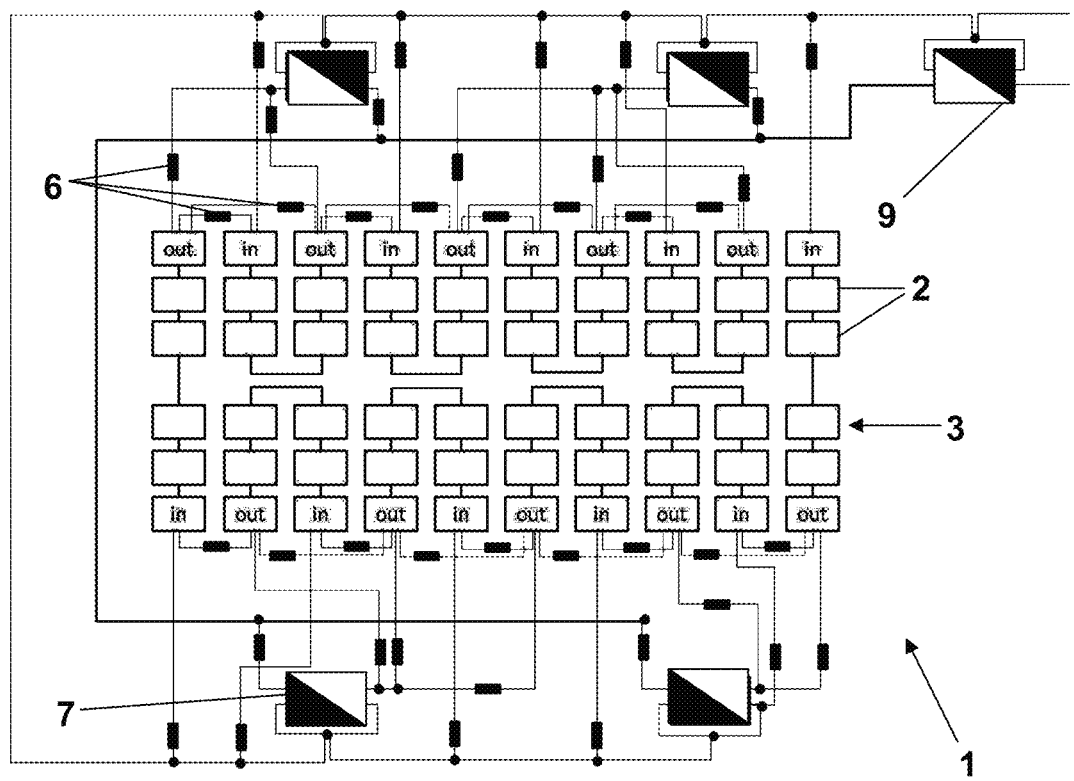
FIG. 3 illustrates a photovoltaic module, according to example embodiments.
Figure 6:
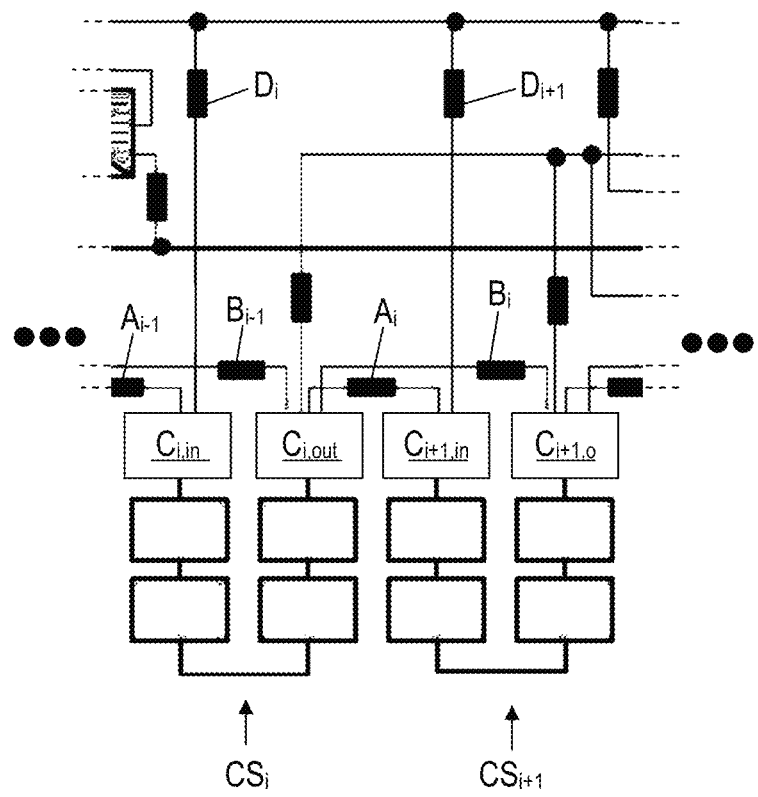
FIG. 6 shows a detail view of two cell strings in a photovoltaic module, according to example embodiments.

FIG. 3 shows an example module in accordance with embodiments, e.g. corresponding to the architectural template shown in FIG. 2. Furthermore, FIG. 6 shows a detail view of two cell strings in this example module and the connection structure associated therewith. The module shown in FIG. 3 corresponds to a grid having a size of 6 by 10 cells. The orientation of the cell strings is clarified by the "in" and "out" annotations. However, this is only by way of example, and embodiments may relate to an M by N rectangular array of cells, in which M and N may be arbitrary positive integers, insofar each equal to or larger than 4.

A photovoltaic module according to embodiments also comprises a plurality of reconfigurable interconnects 6 for electrically interconnecting the plurality of cell strings 5 such that a global photovoltaic string consisting of an electrical series connection of the plurality of cell strings 5 can be controllably established.

For example, the plurality of reconfigurable interconnects 6 may comprise a network of switches to enable different configurations of the cell-strings, e.g. into serial, parallel and/or hybrid electrical network configurations.

A network of wires and switches of the module to interconnect the cell-strings, e.g. comprising the reconfigurable interconnects 6 and the non-reconfigurable interconnects, may depend on a configuration of the at least one DC-DC converter.

The plurality of reconfigurable interconnects may be adapted for in operation directing current from the plurality of PV cells to the at least one DC-DC converter.

However, the reconfigurable interconnects 6 may be adapted for connecting all cell strings in a single electrical series, e.g. for operation under uniform irradiation conditions, as well as in other configurations, e.g. for non-uniform irradiation conditions.

The plurality of reconfigurable interconnects 6 may for example comprise a plurality of switches, as illustrated in FIG. 6, in which each switch $A_i$ has a first terminal electrically connected to the last cell $C_{i,out}$ of a corresponding cell string $CS_i$ and a second terminal electrically connected to the first cell $C_{i+1,in}$ of another cell string $CS_{i+1}$, in which this first cell $C_{i+1,in}$ is adjacent to that last cell $C_{i,out}$.

For example, serial interconnection of two cell-strings may only use one switch between the "out" pin of one cell-string and an "in" pin of another cell-string. Therefore, the current may remain low, and thus the resistive losses can remain low as well.

In some embodiments, the initial manufacturing cost can be relatively low. For example, other approaches may use additional switches in a non-peripheral part of the module, e.g. in or near the middle of the module, which may be expensive to manufacture. The reconfigurable interconnects in accordance with some embodiments may be arranged on, at and/or near the edges of the module.

Dynamic PV configuration can be achieved by partitioning the module or global PV string into smaller permanently series-connected cells, e.g. connected by a persistent connection during operation formed by the non-reconfigurable interconnects, which can be dynamically combined in several interconnection options during operation.

The plurality of reconfigurable interconnects 6 for electrically interconnecting the plurality of cell strings 5 such that a global photovoltaic string consisting of an electrical series of the plurality of cell strings 5 can be controllably established may be arranged such that the global photovoltaic string, e.g. a module-level global photovoltaic string, connects neighboring cell strings of the plurality of cell strings 5 in an electrical series.

The reconfigurable interconnects, and wiring and/or conductive paths associated therewith, for connecting neighboring cell strings in an electrical series may provide a good performance of the configurable module under uniform irradiation conditions, e.g. in which the global photovoltaic string configuration may be used. For example, the template shown in FIG. 2 and a possible corresponding module shown in FIG. 3, in accordance with some embodiments, may allow a configuration of the photovoltaic cells in a global serial string without using long wires, e.g. by having a total interconnecting conductive path of a low length. Thus, this template and module may provide a good flexibility of the module under non-uniform conditions, e.g. a flexibility for generating E-yield gains with respect to a non-dynamic and/or non-reconfigurable module, while only a small performance loss of the configurable module under uniform irradiation conditions is imposed, with respect to a non-dynamic and/or non-reconfigurable module. The template configuration shown in FIG. 1 may use longer conductive paths, e.g. wires for connecting the upper cell strings to the lower cell strings in a uniform irradiation configuration, e.g. the global cell string, than the configuration shown in FIG. 2. Thus, higher resistive losses may be presented in this configuration, as the inputs and output of neighboring cell strings in the electrical series of the global cell string are not always adjacent. However, a module corresponding to the template shown in FIG. 1 may provide a better flexibility than the module of FIG. 3 when a shading pattern is moving in the direction of the columns as depicted, e.g. a north-south direction.

Figure 4:
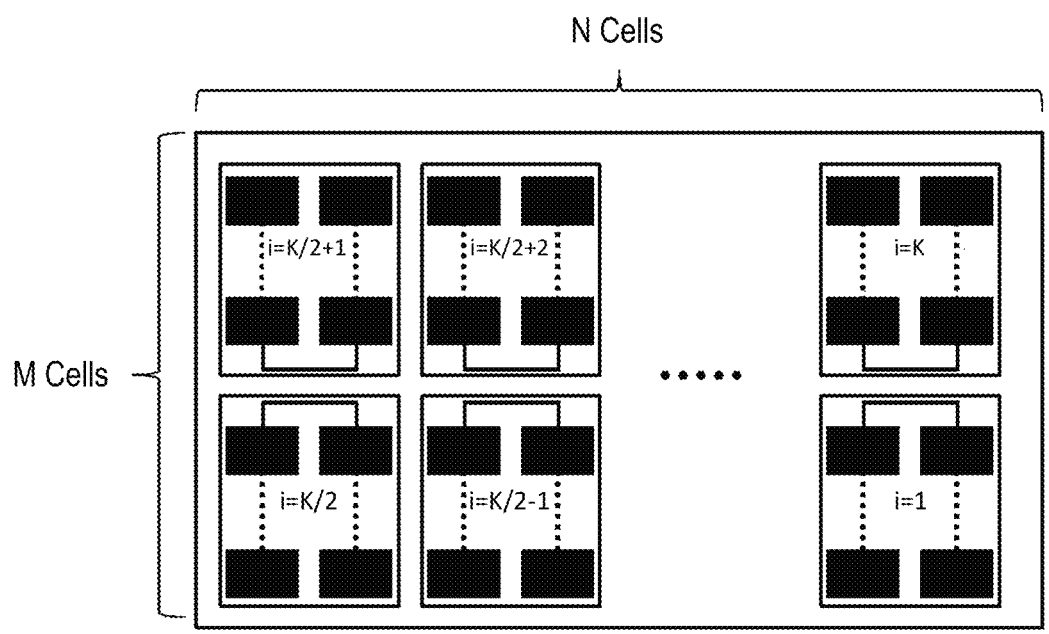
FIG. 4 shows an enumeration of cell strings in the first example template architecture for a photovoltaic module, according to example embodiments.
Figure 5:
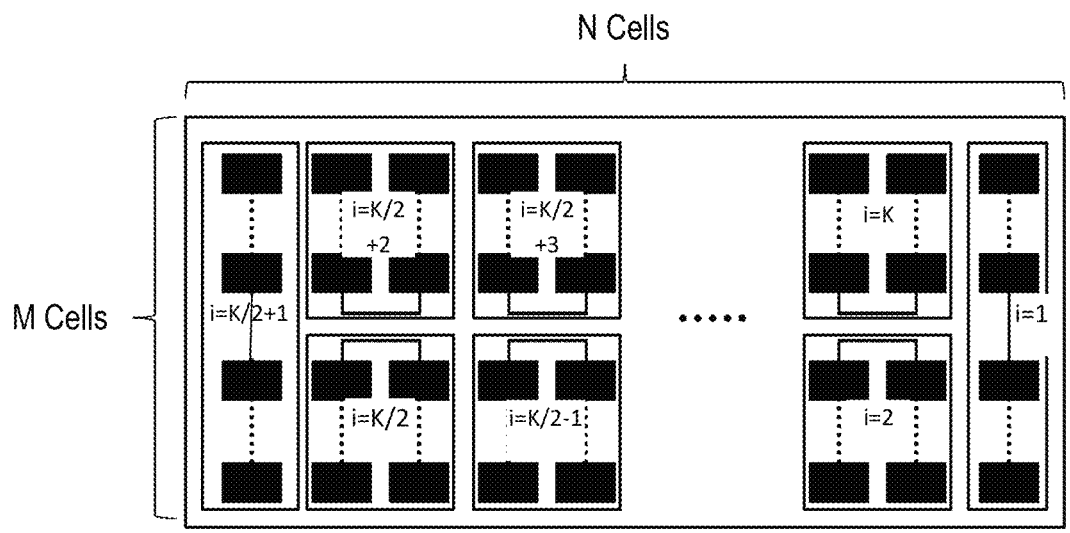
FIG. 5 shows an enumeration of cell strings in the second example template architecture for a photovoltaic module, according to example embodiments.

For an architectural template, as shown in FIG. 1, comprising a first plurality of U-shaped cell strings, in which each U shaped cell string has an first cell "in" and a last cell "out", adjacent to each other, on the first row of the grid, and a second plurality of U-shaped cell strings, in which each U-shaped cell string has a first cell "in" and a last cell "out", adjacent to each other, on the last row of the grid, and that is configured in operation using the reconfigurable interconnects 6 to form the global photovoltaic string, the second plurality of U-shaped strings i=1, i=2, . . . , i=K/2 may be connected into a first half of the electrical series and the first plurality of U-shaped strings i=K/2+1, i=K/2+2, . . . , i=K may be connected into a second half of the electrical series. An example of the sequence of the cell strings in this first example architecture is shown in FIG. 4. Likewise, an example of the sequence of the cell strings in the second example architecture, illustrated in FIG. 2, is shown in FIG. 5.

An all series connection can be used under uniform operating conditions, because it allows to restrict the current and hence to reduce the important resistive losses. Assuming that all cells have similar electrical response at run-time under uniform irradiation, a module in accordance with some embodiments may deviate little from the conventional, non-reconfigurable solution when the reconfigurable interconnects are configured to provide the global photovoltaic string serial configuration.

The plurality of reconfigurable interconnects is furthermore adapted for controllably establishing at least one parallel electrical circuit having parallel circuit legs formed by at least two adjacent cell strings 5. For scenarios where mostly uniform irradiation conditions are presented, the reconfigurable interconnects may be controlled such as to form a series connections between the cell strings. For a non-uniform irradiation case, the reconfigurable interconnects may be controlled to form parallel connections.

For example, as already mentioned hereinabove, the plurality of reconfigurable interconnects 6 may comprise a plurality of switches $A_i$ for enabling a serial connection to form a global, e.g. a module level, string, each switch having a first terminal electrically connected to the last cell "out" of a corresponding cell string and a second terminal electrically connected to the first cell "in" of another cell string, in which this first cell "in" is adjacent to that last cell "out". However, the plurality of reconfigurable interconnects may also comprise a further plurality of switches $B_i$ for enabling at least one parallel electrical circuit having parallel circuit legs formed by at least two adjacent cell strings. For example, a switch $B_i$ of this further plurality of switches may have a first terminal electrically connected the last cell $C_{i,out}$ of a corresponding cell string $CS_i$ and a second terminal electrically connected to the last cell $C_{i+1,out}$ of another cell string $CS_{i+1}$, in which the first cell $C_{i+1,in}$ of this other cell string is adjacent to the last cell $C_{i,out}$.

Furthermore, the plurality of reconfigurable interconnects 6 may comprise a yet further plurality of switches $D_i$, $D_{i+1}$ for applying the same voltage level to the first cells $C_{i,in}$, $C_{i+1,in}$ of the at least two adjacent cell strings $CS_i, CS_{i+1}$, when, while in operation, the at least one parallel electrical circuit is established.

For example, a configurable parallel connection of two cell-strings may have one switch, indirectly or directly, connecting the "in" pins of these two cell-strings while another switch, indirectly or directly, connects the "out" pins of the same two cell-strings. In such parallel configuration, the current accumulates, and thus the resistive losses of succeeding wires may increase. Parallel connections therefore may cause a potentially substantial loss. The reconfigurable architecture in accordance with embodiments allows the establishment of such parallel connections in specific situations where a performance advantage exists, e.g. under heavy shading, while not significantly reducing the performance under typical uniform lighting conditions.

The reconfigurable interconnects in accordance with some embodiments may be arranged on, at and/or near the edges of the module.

The reconfigurable interconnects in accordance with some embodiments may be adapted for controllably connecting only neighboring cell-strings directly. This may keep the requirements for additional components, with respect to a conventional, non-reconfigurable module, low. For example, in the example configuration shown in FIG. 3, an efficient series connection may be provided by allowing all neighboring cell-strings to be potentially connected through a plurality of switches. For parallel connections of cell-strings under partial shading, neighboring cell-strings can also be connected in parallel. Few extra components are required, since only neighboring cell-strings are potentially connected. This restriction of potential cell-string connections may determine the type of groups that can be formed.

Since only neighboring cell-strings may be configurably connected, e.g. potentially connected, in series or in parallel, e.g. neighboring in the sense of an enumeration such as shown in FIG. 4 or FIG. 5, in accordance with embodiments, blocks of consecutive cell-strings may be configured in operation to form groups. For example, each group may have its cell strings configured in operation in a serial or in a parallel configuration.

The photovoltaic module 1 is furthermore adapted for connecting the plurality of cell strings to at least one DC-DC converter 7, e.g. to a plurality of DC-DC converters, e.g. to two DC-DC converters, or to four DC-DC converters, or to five DC-DC converters, or to even more DC-DC converters. For example, the reconfigurable interconnects 6 may be adapted for electrically connecting the plurality of cell strings to at least one DC-DC converter 7, e.g. to a plurality of DC-DC converters, e.g. to two DC-DC converters, or to four DC-DC converters, or to five DC-DC converters, or to even more DC-DC converters. This at least one DC-DC converter 7 is adapted for providing an output electrical power over an output line.

For example, the photovoltaic module may comprise at least one DC-DC converter 7, e.g. a plurality of DC-DC converters, such as two, three, four, five or even more DC-DC converters, electrically connected to the plurality of cell strings, e.g. via the reconfigurable interconnects. A plurality of DC-DC converters can be able to dynamically, at run time, decide the number of converters to be used, if the reconfigurable interconnects 6 are suitably adapted for this.

Figure 8:
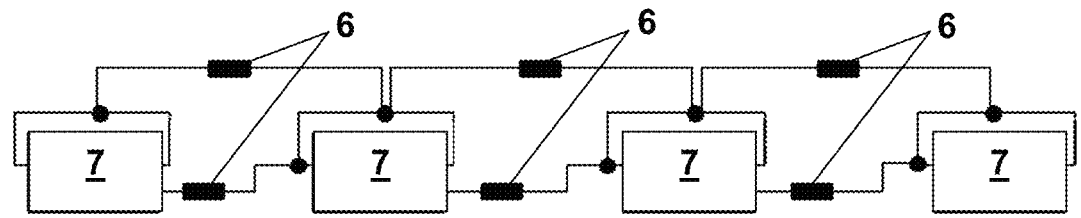
FIG. 8 shows a switch network configuration for allowing a dynamic number of series-connected converters to be active at run-time, according to example embodiments.

Each DC-DC converter 7 may be adapted for being in an active or inactive state. For example, the reconfigurable interconnects 6 may be adapted for including and excluding every DC-DC converter 7, in response to a control signal, from an electrical path between the plurality of photovoltaic cells 2 and the output line. Thus, the reconfigurable interconnects 6 may comprise at least one switch for allowing to bypass at least one of the DC-DC converters when the DC-DC converter is set to an inactive state. FIG. 8 depicts a configuration for a network of switches to allow a dynamic number of series-connected converters to be active at run-time. It shall be clear to the skilled person that this example can be extended to any larger number of local DC-DC converters.

The number of converters active at run-time may depend on the number of groups formed in the module. Each group may be connected to an individual converter. The irradiation level of the cell-strings along with available interconnection wires may determine the number of groups formed.

Each DC-DC converter 7 may be configured for tracking the maximum power point of a corresponding group of cell strings being connected thereto via the reconfigurable interconnects 6. For example, each DC-DC converter may be adapted for receiving a control signal from a controller, e.g. for selecting a duty cycle, such as to track the maximum power point of its corresponding group at run-time. For example, the current and the voltage may differ for each of these groups.

Each DC-DC converter 7 may have a local output, and the plurality of DC-DC converters may be interconnected such that the module has a single output line. For example, the local outputs of the plurality of DC-DC converters 7 may be interconnected such as to positively contribute to a single electrical output power over the output line. The duty cycles of the DC-DC converters may form suitable knobs to enable different output connections. For example, the at least one controller may be adapted for controlling the duty cycles of the converters such as to provide a suitable module output current and/or voltage.

Figure 7:
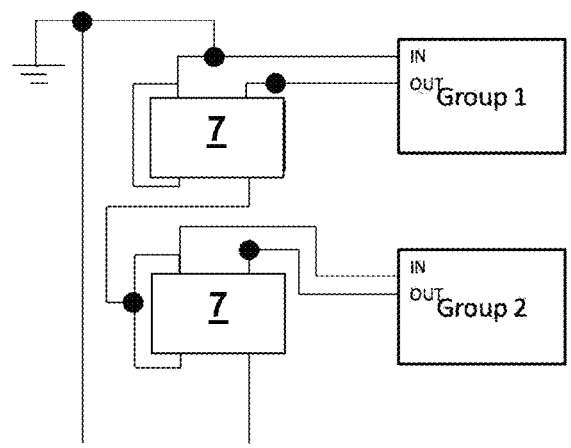
FIG. 7 shows DC-DC converters connected in series to form a voltage increment configuration, according to example embodiments.

The plurality of DC-DC converters 7 may comprise at least two DC-DC converters interconnected in a voltage increment configuration. When the converters are connected in series, as depicted in FIG. 7, the output voltages of the converters are added up. The total voltage of the configuration is substantially equal to the sum of all the voltages at the outputs of the converters, while substantially the same current flows through the output of the converters. Since the current at the output stage of all converters has to be substantially equal, the duty cycles of the converters can be regulated to ensure this. However, the conversion range of the converters may limit the maximum irradiation difference of the groups of cell strings that can be accommodated. For example, if a current difference exceeds the maximum limit, less than the total available power may be recovered.

The controller may be adapted for controlling the duty cycle of each of the converters in a coordinated manner, e.g. the duty cycle of the converters which are active in each configuration are not selected independently.

For example, if the number of converters were equal to the number of cell-strings, each cell-string would connect to an individual converter. Since the current of series connected converters should be equal, the local converters should be able to both boost the voltage, e.g. reduce the current, and reduce the voltage, e.g. boost the current. Assuming a conversion factor k for both buck and boost mode of the converter, a maximum current difference of cell-strings that could be handled is $I_{max}/I_{min}=k^2$. The accumulated current would therefore have a level of $I_{min}*\text{sqrt}(I_{max}/I_{min})$ which is the same as $I_{max}/\text{sqrt}(I_{max}/I_{min})$. Setting the appropriate duty cycle for each converter may use a complex control system, but may be feasible.

Reducing the number of converters from the number of cell-strings to X and maintaining the same level of flexibility within the module may utilize a more complex supporting network of wires and switches, as provided by a module 1 in accordance with some embodiments. A trade-off may be present here between the additional hardware requirements and the reduction of flexibility.

The plurality of DC-DC converters 7 may comprise at least two DC-DC converters interconnected in a current accumulation configuration. For example, the DC-DC converters may be interconnected in a parallel configuration, in which the outputs of the converters are electrically connected in parallel. In another example, the DC-DC converters may be interconnected in a cascaded configuration.

Figure 9:
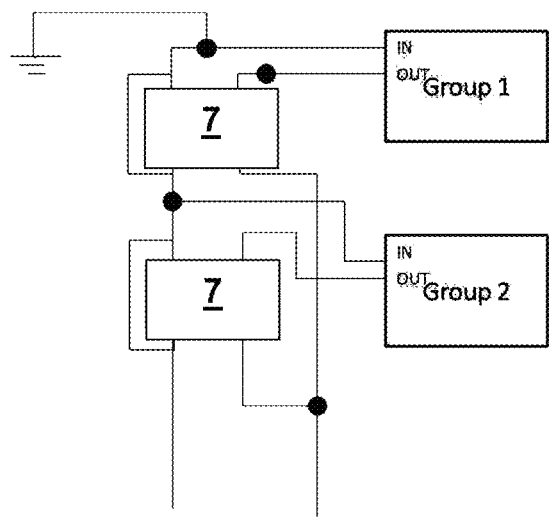
FIG. 9 shows DC-DC converters having outputs connected in parallel to form a current accumulation configuration, according to example embodiments.

FIG. 9 shows an example parallel connection of the converters. In such configuration, the outputs of the converters are connected in parallel, such that the currents at the output stages of the converters are added, while the voltage should be substantially the same at the outputs of all converters. In such configuration, the duty cycle of all converters may be regulated to ensure that the voltage at the output stage is the same. As in the series case described hereinabove, the duty cycle of the active converters may be selected in a coordinated manner, e.g. not independent from each other. Thus, each group may reach the common voltage of the module's output. In this case, the conversion range of converters may limit the maximum voltage difference of the groups, such that voltage differences which are too high can lead to power losses.

Figure 10:
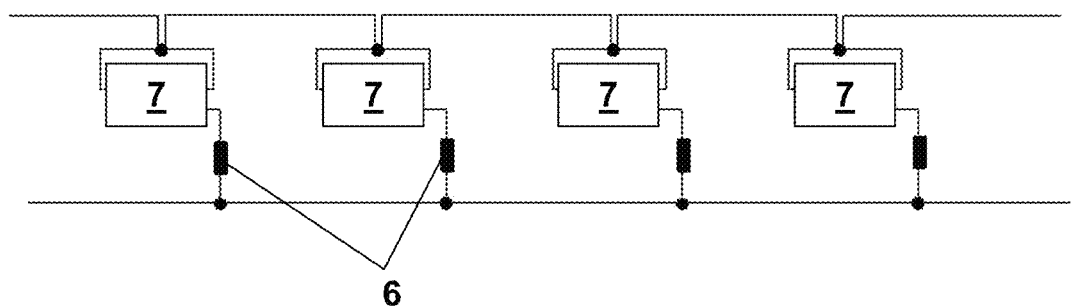
FIG. 10 shows a switch network configuration for allowing a dynamic number of parallel-connected converters to be active at run-time, according to example embodiments.

If all cell-strings have the same number of cells, e.g. in a module in accordance with some embodiments, the voltage difference between cell-strings can be limited. Under uniform conditions, all cell-strings may be configured such as to be connected in series, and this series may be connected to a single converter. Under non-uniform irradiation conditions, all available converters may be active. An example network of switches, e.g. forming part of the reconfigurable interconnects, for dynamically altering the number of active parallel-connected converters is shown in FIG. 10. It shall be clear to the skilled person that this example can be extended to any larger number of local DC-DC convertors.

In an example embodiment, a plurality of DC-DC converters 7 may be connected in parallel. Each DC-DC converter may be controlled by a controller to track the maximum power point of the group of cell strings connected thereto in operation via the reconfigurable interconnects 6. The controller for tracking this maximum power point may be integrated in each corresponding DC-DC converter. Since the maximum power point of each group may be tracked independently, a robust system may be provided by using at least partly decentralized control. When each group of cell strings has its cell strings configured in a parallel configuration, all DC-DC converters may be active in the parallel DC-DC converter configuration, in order to avoid that the current in any group is too high. Furthermore, a module in accordance with embodiments may comprise a further DC-DC converter, attached to the output of the plurality of DC-DC converters connected in parallel, to boost the output voltage to predetermined level, e.g. for connection to the rest of a PV array of which the module forms a part. An example configuration of such an embodiment is shown in FIG. 3.

Such parallel configuration can provide, where a series connection of the converters and the cell-strings may utilize a complex control scheme, a control of a network of parallel converters in accordance with some embodiments that can be relatively simple, e.g. particularly in a run-time configuration where also the cell-strings connected as a group to each of the converters are configured in parallel. However, the network of reconfigurable interconnects in accordance with such embodiment may also enable the configuration of all cell strings in a series, e.g. and connected to a single converter, in another run-time configuration. For example, for scenarios where mostly uniform irradiation conditions are present, a series connections between the cell strings, e.g. and a single active converter, may be configured, e.g. by the controller, while for a mostly non-uniform case, parallel connections of the cell-strings, e.g. and parallel connections of the converters, may be selected.

Such parallel configuration can provide for, where a series connection of the converters and the cell-strings may utilize expensive buck-boost converters, the converters for a network of parallel converters in accordance with some embodiments that can be relatively simple and cheap.

Figure 11:
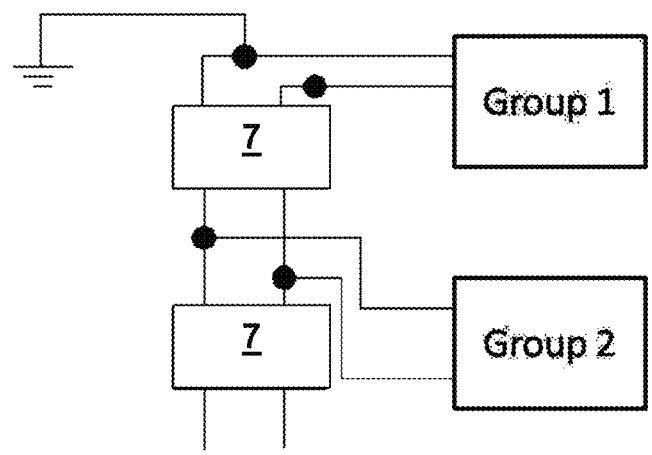
FIG. 11 shows DC-DC converters connected in a cascade to form a current accumulation configuration, according to example embodiments.
Figure 12:
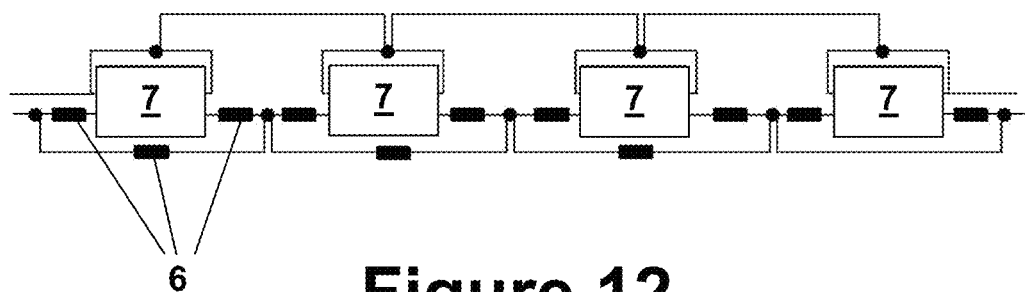
FIG. 12 shows a switch network configuration for allowing a dynamic number of cascaded converters to be active at run-time, according to example embodiments.

Another way to have current accumulation at the converter stage is to connect the local converters in a cascaded way. A cascaded connection of two groups of cell-strings is illustrated in FIG. 11. In a cascaded connection of converters, the output voltage of the previous converter in a chain is connected to the input of the next converter in the chain, and in parallel to the group corresponding to the latter converter. The current is accumulated as the output of a converter is connected in parallel to the input of the next converter. With this type of connection between the converters, the power of each stage may be reduced, e.g. depending on the efficiency of the converters. The output of each converter can be set, e.g. by configuring the duty cycle of the converter, at the voltage of the maximum power point of the next group of cells. The only "free converter," e.g. in terms of a degree of freedom of the value of the duty cycle, may therefore be the last one in the chain. The current produced by all cells may be added, while the obtained voltage may be equal to the voltage of the last group of cells, after the conversion stage. However, the voltage of each group, except the last group, may be able to reach the voltage of the maximum power point of the next group after applying the conversion factor of the converters. Therefore, groups whose voltage difference is larger than the conversion factor cannot be efficiently connected. Flexibility is provided in the duty cycle of the last converter, but a disadvantage of the cascaded connection of the converters may exist in continuous power losses due to multi-stage conversion and conversion efficiency. An example network of switches for dynamically controlling the number of active cascaded converters is shown in FIG. 12.

Where in conventional modules, bypass diodes are used to protect cells from hot-spot heating and to allow high current operation of series connected cells in case of partial shading, a reconfigurable topology in accordance with some embodiments allows a recovery of power that would be lost due to such bypassing or current reduction, by grouping cells with similar electrical behavior at run-time. This on-site grouping of cells can be achieved via the reconfigurable interconnects, e.g. through a network of wires and switches, and by a plurality of DC-DC converters. For example, each cell group, having a set of cell strings assigned thereto during operation by a controller, may be connected to a corresponding local DC-DC converter. At this DC-DC converter, the duty cycle, and thus the voltage, may be controlled e.g. set to a specific value for the specific group. This duty cycle may be controlled by a controller, e.g. using an MPPT algorithm.

The plurality of reconfigurable interconnects 6 are adapted for receiving a control signal from at least one controller, e.g. from one controller, for controlling the plurality of reconfigurable interconnects. The at least one controller is adapted for forming, when in operation, parallel, serial and/or hybrid connections of the plurality of cell strings to cluster matching photovoltaic cells in response to a non-uniform photonic stimulation. The at least one controller may be adapted for, e.g. configured for or programmed for, implementing a maximum power point tracking algorithm.

The at least one controller may also be adapted for controlling the duty cycle of the at least one DC-DC converter, e.g. of a plurality of DC-DC converters.

The module 1 may comprise the at least one controller. However, the at least one controller may also be an external component, e.g. a plant control computer, adapted for simultaneously controlling a plurality of modules 1, independently with respect to each other or in a coordinated fashion. Thus, a controller for controlling the module 1 may be a global controller for controlling a plurality of modules 1 in a coordinated system.

The plurality of reconfigurable interconnects 6 may be adapted for receiving a control signal from one controller, e.g. either an external controller or a controller comprised in the module, for providing a global module-level control. Thus, the controller and a small number of DC-DC converters, e.g. a limited set of DC-DC micro converters, can efficiently group cells with similar characteristics in the field, even in the presence of unknown and highly variable shading.

The at least one controller may be adapted for configuring variables, e.g. knobs, such as switches in the plurality of reconfigurable interconnects and the DC-DC converter duty cycles, to optimize electric power yield under non-uniform conditions. Some embodiments can provide adaptability, e.g. flexibility, while maintaining an efficient series connection for use under uniform irradiation conditions.

For example, when a module in accordance with some embodiments comprises a plurality of DC-DC converters connected in series, a current may be controlled by the controller to be equal for each DC-DC converter, e.g. by suitably adjusting the duty cycles of the converters. For example, the module may be supplied by a current source and the duty cycle of each converter may be adjusted by the controller such as to extract a maximum power from each corresponding group while maintaining the imposed current at their output.

In another example, when a module in accordance with certain embodiments comprises a plurality of DC-DC converters connected in parallel, e.g. the converters share the same output, or connected in a cascade, e.g. the converters share their output with the input of the next group, a steady voltage may be applied between the single input and output pin of the module. In such case, each local converter may be equipped with a simple MPPT. For example, the at least one controller may comprise a plurality of controllers, each integrated with or in a corresponding DC-DC converter.

In the parallel case, each converter may be independently controlled, e.g. to operate independently and track its group maximum power point.

In the cascaded case, the maximum power point of the last group in the cascade may affect the duty cycle of the previous converter and thus the latter may be controlled such as to take this into account.

The at least one controller may be adapted for controlling the reconfigurable interconnects and the duty cycles of the DC-DC converters. Several connection possibilities may arise, depending on the configuration of the cell strings and of the DC-DC converters.

For example, each group of cell strings may have a corresponding input and output connected to a single converter. Therefore, each combination of connection scheme of group and converter interconnections may lead to a different supporting network. Following example scenarios may be distinguished: Series-Series, Parallel-Parallel, Series-Parallel and Parallel-Series.

In a Series-Series configuration, a group of cell strings that is connected in series has an input and output of the group connected to the same converter. The input and output pins of the group belong to different cell-strings. The input of a group may be bypassed by an inactive converter, but if the previous converter is active, it may connect directly to the corresponding converter. Both the input and output of each cell string may have potential connections with multiple converters. In order to prevent power loss in the converter stage, all groups may reach the same current output. The overall current of each group of series-connected cell-strings may be equal to the current produced by the poorest cell in that group. This mainly depends on the irradiation level, as the current is proportional to the incident irradiation. The irradiation difference within the module can surpass the conversion factor of the converters. However, an intermediate output current value may be selected, which may lead to expensive converter architectures that allow both boosting and reducing of the current.

In a Parallel-Parallel configuration, a group of cell-strings that is connected in parallel has a number of input pins and output pins equal to the number of cell-strings in the group. The input of all cell-strings is the same and can be shared through the converter interconnections. If the output of each cell-string connects to a single converter, each group may still have potential connections to multiple converters since there are multiple instances of outputs in the group. In any case, the number of connections of the output pins to the converters can be limited with no significant loss of flexibility. Lossless parallel connection of converters may utilize the same voltage output. All groups therefore may be able to reach a certain voltage value. The voltage of groups does not alter significantly with operating conditions. This may allow all groups to connect to a reduced voltage value, compared to the series-series connection, with simple converter topologies.

In a Series-Parallel configuration, when connecting groups of cell strings in series and converters in parallel, a danger of mismatch may be present on the outputs of the converters. The number of cell-strings in a group affects the output voltage. When this configuration is selected, the division of groups in the module may be carefully selected, such that the voltage difference is covered by a given conversion range.

In a Parallel-Series configuration, parallel connections of the cell-strings increase the current. Irradiation differences in combination with parallel connections of cell-strings may increase the potential current differences of groups, and hence the losses.

Some embodiments provide a configurable topology in which the series resistance in switches and wires can be significantly optimized, e.g. by selection of the size and I-V dimensioning of the switches and selection of wire width, for both the serial configuration, for use under uniform irradiation conditions, and the parallel or hybrid configurations or stubs, for use under specific non-uniform irradiation conditions.

Some embodiments provide cost-effective devices and systems, e.g. in terms of added component cost, for example a cost not far above that of a standard statically series-connected module, while also achieving a useful E-yield enhancement under many shading conditions. For example, a good E-yield enhancement can be achieved relative to a theoretic optimum of a fully customized cell connection solution, which would be costly to fabricate and would not be flexible to varying shades.

In a further aspect, some embodiments also relate to the use of a module according to the first aspect in a building-integrated photovoltaic system (BIPV) and/or in roof panels adapted for use under non-uniform, non-ideal irradiation conditions. Such use in accordance with embodiments can provide good adaptability for effects caused by shades, soiling, snow, clouds and/or non-uniform temperature/wind effects can be achieved.

Some embodiments also relate to the use of a module according to the first aspect in, on or for electric vehicles, such as cars or public transport vehicles.

In a further aspect, some embodiments also relate to a method for operating a photovoltaic module, e.g. a photovoltaic module in accordance with embodiments of the first aspect. This method may be executed, at least partly, by the at least one controller for sending at least one control signal to the plurality of reconfigurable interconnects 6, for forming, when in operation, parallel, serial and/or hybrid connections of the plurality of cell strings 5 to cluster matching photovoltaic cells in response to a non-uniform photonic stimulation.

A method according to certain embodiments comprises obtaining a photovoltaic module 1 comprising a plurality of photovoltaic cells 2. These photovoltaic cells are arranged in a grid having logical rows 3 and columns 4. The module 1 also comprises a plurality of non-reconfigurable interconnects electrically interconnecting subsets of the plurality of photovoltaic cells to form a plurality of cell strings 5. Each cell string 5 comprises at least four photovoltaic cells connected in an electrical series from a first cell to a last cell, the first cell and the last cell being located on the same edge of the grid, e.g. the same first row, last row, first column or last column. The last cell is furthermore adjacent to a first cell of an adjacent cell string. Additionally or alternatively, the first cell is adjacent to a last cell of an adjacent cell string. The photovoltaic module 1 may also comprise a plurality of reconfigurable interconnects.

The method further comprises determining whether the photovoltaic module 1 is subject to a non-uniform photonic stimulation, for example by receiving and analyzing at least one of: light measurements, current measurements, voltage measurements, electrical resistance measurements, temperature measurements, weather forecast data and pre-recorded shading patterns.

The method also comprises controlling a plurality of reconfigurable interconnects 6 of the photovoltaic module 1 to electrically interconnect the plurality of cell strings 5 such that a global photovoltaic string consisting of the plurality of cell strings 5 electrically connected in series is established and connected to a DC-DC converter 7, e.g. connected in series to a single, active DC-DC converter, when the photovoltaic module 1 is determined to be subject to a substantially uniform photonic stimulation.

The method also comprises controlling the plurality of reconfigurable interconnects 6 to establish at least one parallel electrical circuit having parallel circuit legs formed by at least two adjacent cell strings 5 such as to cluster matching photovoltaic cell strings when the photovoltaic module 1 is determined to be subject to substantially non-uniform photonic stimulation.

The method may also comprise determining a number of active DC-DC converters to connect in parallel to the plurality of cell strings 5, in which this number is determined taking the determined non-uniform photonic stimulation into account.

The method may comprise controlling the plurality of reconfigurable interconnects 6 to establish a plurality of parallel electrical circuits, each parallel electrical circuit having parallel circuit legs formed by at least two adjacent cell strings 5, and controlling the plurality of reconfigurable interconnects 6 to establish an electrical connection of each of the plurality of parallel electrical circuits to a corresponding active DC-DC converter.

The steps of controlling the plurality of reconfigurable interconnects also comprise sending at least one control signal from at least one controller to the plurality of reconfigurable interconnects 6.

The method may also comprise controlling a duty cycle of each active DC-DC converter, such as to implement a maximum power point tracking algorithm.

Following examples illustrate aspects of some embodiments. These examples are not intended to be limiting in any way, but merely to aid the skilled person in understanding principles and aspects and in reducing to practice various embodiments.

In a first example, the interconnection of the cell-strings in accordance with the example embodiment shown in FIG. 3 is illustrated.

Assume that, in a shading pattern, cell-string (k−1) has a value of current and voltage at the maximum power point of respectively $I_{k-1}$ and $V_{k-1}$, while cell-string k has values of $I_k$ and $V_k$, and cell-string (k+1) has values of $I_{k+1}$ and $V_{k+1}$. First, we will consider a series connection configuration of the cell-strings.

If $I_{k-1}$ significantly differs from $I_k$, cell-strings (k−1) and k should not belong to the same series-connected group as the difference of their current at the MPP would deteriorate the performance of at least one of the two cell-strings. Thus cell-string (k−1) should belong to group x and cell-string k to group (x+1). If cell-string (k+1) has a similar current value as cell-string (k−1), the two cell-strings cannot belong to the same group as there is no available wire for their connection and cell-string (k+1) belongs to groups (x+2). With series connection within the groups, in this example for three cell-strings, three groups are formed and three converters may be used.

In the same example, a parallel connection of cell-strings (k−1) and k may not significantly deteriorate any cell-string. For example, an extreme irradiation difference of 90% may correspond to a current and voltage difference at the MPP of 89.99% and 2.25% respectively. Therefore, connecting these two cell-strings in series may result in a 79% power loss, while connecting them in parallel may lead to a power loss of less than 0.04%. This means that in this parallel connection, one group may be formed and only one converter may be used.

In order to reduce the cost, only a small number of local converters may be provided. For example, the availability of local converters at run time may be limited because they are costly. Therefore, parallel connection within groups may be used under non-uniform irradiation conditions. Since the voltage at the MPP would not shift much, all cell-strings could form one group and connect to a single converter. If a single converter is used, the current would reach a level of $M*I_{cell-string}$, which would however increase the resistive losses.

Therefore, multiple groups of parallel cell-strings may be formed in operation, not based on irradiation conditions or not based on irradiation conditions exclusively, but in order to reduce the current. Each group may be connected to a converter which boosts up the voltage and reduces the current. When X converters are available, the maximum current would be $(M/X)*I_{cell-string}$ for each group before the local converters. With a conversion factor of 3, the minimum current output of each group is in the order of magnitude $[(M/X)*\eta*I_{cell-string}]/3$, with $\eta$ being the efficiency of the convertor.

If all the cell-strings have the same number of cells in series, all groups with parallel-connected cell-strings would also have the same number of cells in series. Therefore, all groups would have a similar voltage output. Same voltage output is suitable for a parallel connection of the converters as well. All converters may be connected to an accumulative bus-bar having a low resistance. Each group may thus contribute a current of $[(M/X)*\eta*I_{cell-string}]/3$ to the bus-bar. Only at the end of the accumulative bus-bar, the current may take a value of $[M*\eta*I_{cell-string}]/3$. The number of converters may limit the current output of each group and the corresponding resistive losses of each stage at the bus-bar. Independently of the number of the converters, the current at the end of the accumulative bus-bar may be $[M*\eta*I_{cell-string}]/3$, but more converters may reduce the overall current in parts of the bus-bar that are arranged earlier in the chain.

The following example illustrates some benefits of reconfigurable topologies, e.g. such as used in embodiments disclosed herein, when compared to conventional series-connected modules under non-uniform operating conditions.

Figure 13:
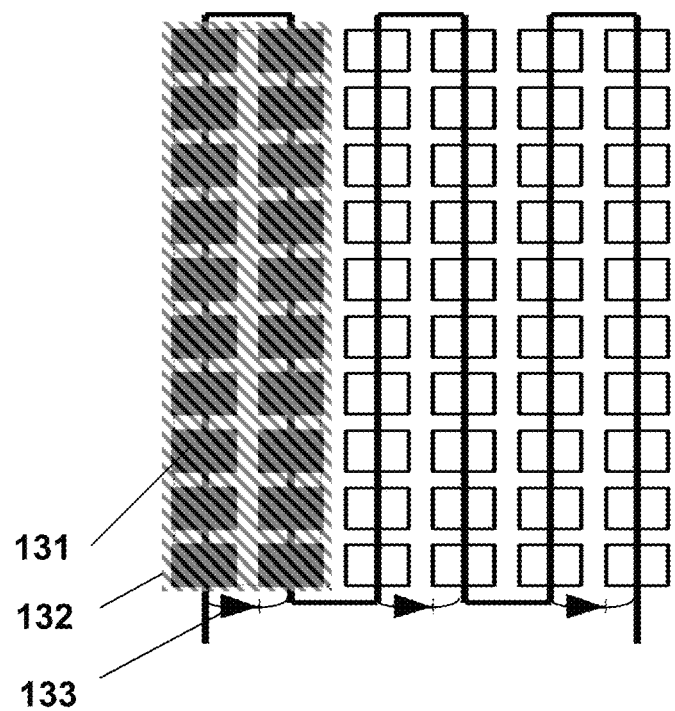
FIG. 13 shows an industrial module as known in the art that is partially shaded.
Figure 14:
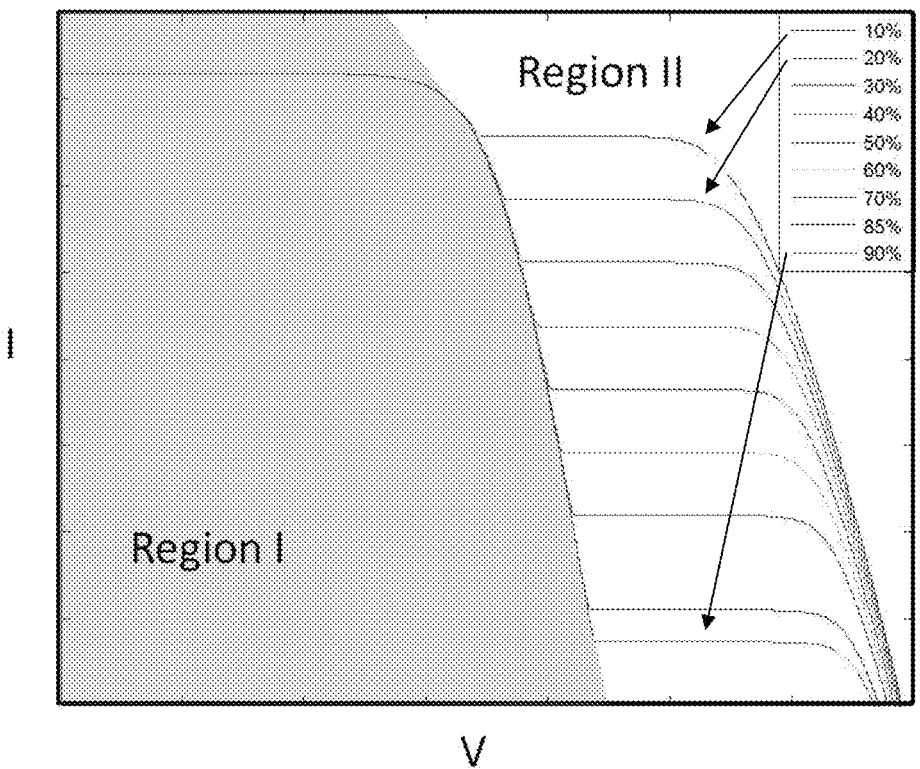
FIG. 14 shows example I-V curves of the prior-art module shown in FIG. 13, for different irradiation densities.
Figure 15:
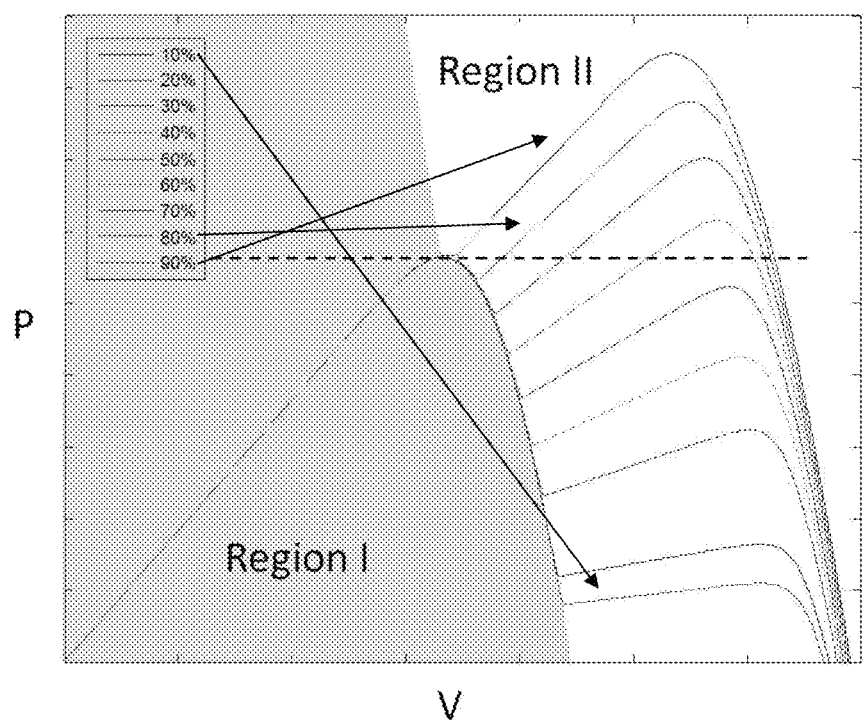
FIG. 15 shows example P-V curves of the prior-art module shown in FIG. 13, for different irradiation densities.

An industrial module as known in the art is illustrated in FIG. 13, which is partially shaded by a shade 132. Such a conventional module may for example consist of 60 cells 131 connected in series, with bypass diodes 133 placed across groups of 20 cells. Example I-V and P-V curves of the module for different irradiation densities are shown in FIG. 14 and FIG. 15 respectively. It can be observed that the arrangement of the bypass diodes and the shape of the casted shadow create two local maxima on the PV curve. The instantaneous curves corresponding to the industrial template of a PV module can be divided in two regions, where in each region the active current path differs. In the first region, corresponding to low voltages, the bypass diode across the shaded cells conducts the excess current of the fully illuminated cells. In the second region, corresponding to high voltages, the overall current is limited to the current produced by the poorer cells and no diode is active. According to the density of the casted shadow, the position of the global MPP differs. The GMPP can be located in region I or region II.

The ideal power produced by the PV module is the output of a custom designed topology for the specific operating conditions. This power is however not equal to the sum of the individual MPP of each cell. In the shading scenario described above, the shaded and fully illuminated cells would operate independently, and separate converters would track the MPP of each group. Note that the total power produced by the module would be lower than the sum of the power of the two groups, since conversion and resistive losses should be taken into account. In the table 1 hereinbelow, the ideal power and the power obtained by industrial modules for each density is shown under the partial shading scenario

TABLE 1

| Shade density (%) | Power of conventional module (W) | Ideal power (W) |
| --- | --- | --- |
| 10% | 160.8 | 168.3 |
| 20% | 154.5 | 164.4 |
| 30% | 143.1 | 160 |
| 40% | 128.1 | 155 |
| 50% | 110.9 | 149.4 |
| 60% | 102.3* | 143.4 |
| 70% | 102.3* | 136.8 |
| 85% | 102.3* | 125.9 |
| 90% | 102.3* | 122.2 | described hereinabove. The asterisk signs indicate cases where the Maximum Power Point lies in region I. Shade densities are provided relative to an irradiation level of 1000 W/m$^2$.

When the MPP of the conventional module lies in region I, the recoverable power comes from the shaded cells which would otherwise be bypassed. In the case of the MPP in the second region, the fully illuminated cells do not have a reduced current and produce a larger amount of power.

Reconfigurable topologies may aim at the independent operation of groups of cells with different operating conditions. A strategic goal for reconfigurable topologies may be to enable at run-time a module configuration which is as close as possible to a custom designed topology for the specific operating conditions.

In order to evaluate a module topology, performance is compared under different conditions with the ideal power produced by an N by M module under the same circumstances. Adding the individual maximum power points of all cells is an unrealistic estimation of the ideal power. Interconnection and conversion losses have to be taken into account. For the reasons explained hereinabove, the ideal power is computed by designing a custom topology for each shading pattern.

A custom designed topology for specific operating conditions divides the cells into groups based on their individual electrical output. The cells within a group can be connected in series or in parallel. Extraction of maximum power in series connection cells requires all cells to share the same value of $I_{mpp}$ (current at the maximum power point) and the voltage of the series-connected cells is added up. Extraction of maximum power in parallel connection requires all cells to share the same value of $V_{mpp}$ (voltage at the maximum power point) and the current of the parallel-connected cells is added up. Series connection may be used for two reasons: the resistive losses in wires may be lower due to lower current values, and the voltage may be gradually increased, which is useful for grid connection or for battery charging applications.

In general terms, a custom topology extracts the maximum available power of the module, including resistive and conversion losses. Custom topologies do not have bypass elements or dynamic elements, such as switches. Given an N by M layout of cells and a known operating scenario, a custom topology is designed to extract the maximum power with the minimum losses.

In real conditions, achieving exactly the same electrical characteristics appears implausible. Each group k may contains cells where the current at the MPP lies in the range of $[I_{k,min}, I_{k,max}]$. The current of the group may then be equal to $I_{k,min}$. The range of values for each group may be chosen carefully, e.g. according to some rules given hereinbelow. The size of this interval depends on the resistive losses of creating more groups and the power loss of adding a "poorer" cell in a group of high performing cells. If a cell or group of cells has a large current difference with all other groups, the power it produces may not be enough to compensate the use of the extra hardware to connect it to the rest of the cells, e.g. an individual converter. In this case, that cell or groups of cells is left out of the custom topology.

Each shading pattern produces a different custom topology. A custom topology for scenario A can be completely unsuitable for the shading pattern of scenario B. Theoretically a configurable topology where each cell comprises a cell-string has the flexibility to achieve the same configuration of cells as the custom topology. The extra hardware cost required to have up to N*M cell-strings, e.g. to have configurable switches and additional wires around each individual cell, may however be economically unviable. Moreover, it may not even lead to the maximal achievable E-yield in practice, because the active paths would include a number of switches and wires in the order of magnitude of several times N by M, which would increase the resistive losses significantly.

In some embodiments, an optimized reconfigurable module may be provided that does not allow "poorer" cells to degrade the performance of the module in a significant way. Since all cells may be organized in cell-strings to reduce hardware overhead, each cell-string may be limited by the current produced by its "poorest" cell. Under uniform conditions, all cell-strings can be connected in a global cell string series, and this single group may be connected to a single high performance converter. Under partial shading conditions of the module, two scenarios may be possible:

1. The "poorest" cell of each cell-string has a similar $I_{mpp}$, which can be considered as equivalent to a uniform operating scenario, and 2. The $I_{mpp}$ of some cell-strings may differ by a significant value, e.g. more than 10%, and reconfiguration of the module could be advantageous.

In some embodiments, the cell-strings of each group may be connected in series or may be connected in parallel. A series connections of cell-strings may be provided by one switch between the "out" pin of one cell-string and an "in" pin of another cell-string. The current remains low, thus the resistive losses can remain low as well. But this would also lead to high accumulated voltages, such that large and expensive switches may be used. Parallel connections of the cell-strings on the other hand may be provided by two switchable connections per cell string pair. One switch may connect the "in" pins of two cell-strings while another switch may connect the "out" pins of the same two cell-strings. The current accumulates, thus the resistive losses of succeeding wires increase. However, this loss may potentially be substantial, so parallel connections may have to be considered with care.

In the following example, the configuration corresponding to an example embodiment illustrated in FIG. 3 is evaluated in a simulation environment. These simulations illustrate potential benefits of a reconfigurable topology under non-uniform operating conditions in accordance with various embodiments. Such simulations may also allow the skilled person to evaluate control decisions on when, e.g. under which circumstances, to switch between different run-time instances of the module, e.g. different configurations.

The solar cell is the basic structure of such PV system. The cell model used was the one disclosed by Catthoor et al., "Presentation of a Verilog-AMS Model for Detailed Transient Electro-Thermal Simulations of PV Modules and Systems," In 29$^{th}$ European Photovoltaic Solar Energy Conference and Exhibition 2014. This model includes temperature dependences. The simulation environment used for this example was Verilog and Spectre.

Wires and switches were included in the simulation through electrical resistances. A behavioral model of the converter is used, where the efficiency for the parallel converters is 95% and of the second stage converter is 98%, which may be considered to lie in an acceptable range.

As illustrated in Table 2, under uniform conditions, a conventional module performs slightly better than the example reconfigurable module in accordance with embodiments. The switches enabling the series connections of the cell-strings are additional components of the reconfigurable topology with respect to the conventional module. These switches add a resistance in the active current path, which may result in some power losses as the current increases. However, even under high irradiation, where the current is higher, the power loss of the reconfigurable module does not exceed 1.5% in this simulation. The power performance of the two topologies are shown in detail in table 2 hereinbelow.

TABLE 2

| Level of irradiation (W/m$^2$) | Power of conventional module (W) | Power of reconfigurable module according to embodiments (W) |
|---|---|---|
| 1000 | 179.54 | 176.99 |
| 900 | 168.56 | 166.4 |
| 800 | 156.02 | 154.25 |
| 700 | 141.81 | 140.53 |
| 600 | 125.73 | 124.75 |
| 500 | 108.29 | 107.6 |
| 400 | 89.04 | 88.61 |
| 300 | 68.22 | 67.99 |
| 200 | 46 | 45.89 |
| 100 | 22.71 | 22.68 |

When the module performs under partial shading, it can be determined if the non-uniformity justifies a switch to another configuration. The smallest group of cells that can be manipulated is a cell-string, consisting of six cells in series in this example embodiment. The shading can be determined either by the percentage of shade density, or by the irradiation level difference between the cells. First we present the case that a single cell-string has a different irradiation level from the rest of the module by 50 W/m$^2$. The results for three different irradiation levels are presented in table 3 hereinbelow.

From the results shown in Table 3, it can be concluded that under high irradiation levels, the non-uniformity level may not be high enough to achieve a gain by readjusting the all-series connection of the reconfigurable module. In low irradiation level though, there may still remain a small gain even if only one cell-string is shaded.

TABLE 3

| Level of irradiation (W/m$^2$) | Power generated by conventional module (W) | Power generated by reconfigurable module reconfigured according to embodiments (W) | Power generated by an all-series-connected reconfigurable module (W) |
|---|---|---|---|
| 1000 Shaded: 950 | 171.2 | 153.2 | 168.8 |
| 500 Shaded: 450 | 101.9 | 95.8 | 101.4 |
| 200 Shaded: 150 | 39.1 | 41.5* | 38.2 |

Experiments have shown that an irradiation difference larger than 10% between cell-strings can justify a switch to parallel connection of cell-strings and converters. However, further experiments and/or simulations may be performed by the skilled person to further determine in detail when a switch is suitable.

TABLE 4

| Level of irradiation (W/m$^2$) | Power generated by conventional module (W) | Power generated by reconfigurable module reconfigured according to embodiments (W) | Power generated by an all-series-connected reconfigurable module (W) |
|---|---|---|---|
| 1000 Shaded: 800 | 161.5 | 151.8 | 159.3 |
| 1000 Shaded: 500 | 114.75 | 148.7* | 113.9 |
| 1000 Shaded: 200 | 50 | 143.5* | 49.9 |
| 500 Shaded: 400 | 94.1 | 93.9* | 49.9 |
| 500 Shaded: 250 | 64.2 | 92.2* | 65.3 |
| 500 Shaded: 100 | 27.1 | 89.2* | 27 |

The non-uniformity level of the module can be increased either by an increase of the shade density or by an increase of the number of shaded cells, see the table 4 hereinabove. This table lists comparative generated powers for the three module architectures considered, for shaded cells with a 20%, 50% and 80% shade density and for a global irradiation level of 1000 W/m$^2$ and 500 W/m$^2$. The asterisk indicator refers to those cases where reconfiguration may be advantageous.

Increasing the number of cells which are shaded, however, does not appear to change the example results presented hereinabove by much. For example, a single shaded cell in a series connection limits the output current of all connected cells. An important parameter that affects the gain of the example configuration in accordance with embodiments is the level of irradiation difference. Instead of having a specific irradiation difference, a shade density will be applied. To clarify, a 10% shade density, means that shaded cells receive 90% of the irradiation of the fully illuminated cells.

As illustrated in Table 4, the reconfigurable module in accordance with various embodiments outperforms a conventional one in high irradiation levels, e.g. at least when the casted shade is dense enough. In lower irradiation levels, even with lower differences, the proposed PV topology appears to be useful.

In conclusion, many PV systems, particularly, but not exclusively, those installed in industrial areas, function under non-uniform operating conditions. Partial shading of the array may cause mismatch effects in PV modules known in the art, and may result in a loss of otherwise potentially recoverable power.

Since shading conditions are typically stochastic, a cell-interconnection topology in accordance with various embodiments may be reconfigured in the field. Hence, such module can be adjusted to the real shading conditions at run-time and may recover all potential energy yield, or substantially all potential energy yield, of the module. For example, if the module is partially shaded, similarly shaded cells can be grouped together and each group can be connected independently to a local converter. This allows minimization of the active components in the active current path.

The simulations presented hereinabove show that a significant gain under heavy shaded conditions, and under significant irradiation differences within the module, can be achieved. The module topology in accordance with various embodiments may be used in installations where partial shading commonly occurs, e.g. is the norm. Furthermore, an all-series connection of the reconfigurable module is possible in accordance with various embodiments that may ensure that minimal losses, e.g. only negligible losses, occur under uniform irradiation conditions.

What is claimed is:
1. A photovoltaic module comprising:
a plurality of photovoltaic cells arranged in a grid having logical rows and columns;
a plurality of non-reconfigurable interconnects electrically interconnecting subsets of the plurality of photovoltaic cells to form a plurality of cell strings, wherein the plurality of cell strings comprises:
a first plurality of U-shaped cell strings;
a second plurality of U-shaped cell strings;
a first linear edge cell string; and
a second linear edge cell string; and
a plurality of reconfigurable interconnects,
wherein the plurality of U-shaped cell strings forms a partition of the plurality of photovoltaic cells,
wherein each U-shaped cell string of the first plurality of U-shaped cell strings interconnects only cells located in a first half of rows of the grid,
wherein each U-shaped cell string of the second plurality of U-shaped cell strings interconnects only cells located in a second half of rows of the grid,
wherein the first linear edge cell string interconnects only photovoltaic cells of a first column of the grid,
wherein the second linear edge cell string interconnects only photovoltaic cells of a last column of the grid,
wherein the plurality of reconfigurable interconnects are arranged only on edges of the photovoltaic module,
wherein the plurality of reconfigurable interconnects is adapted for electrically interconnecting the plurality of cell strings such that a global photovoltaic string consisting of an electrical series connecting the plurality of cell strings can be controllably established,
wherein the plurality of reconfigurable interconnects is adapted for controllably connecting adjacent cell strings electrically in parallel, thereby establishing at least one parallel electrical circuit having parallel circuit legs formed by at least two adjacent cell strings,
wherein the photovoltaic module is adapted for connecting the plurality of cell strings to at least one DC-DC converter for providing an output electrical power over an output line, and
wherein the plurality of reconfigurable interconnects is adapted for receiving at least one control signal from at least one controller for forming, when in operation, parallel, serial, or hybrid connections of the plurality of cell strings to cluster matching photovoltaic cells in response to a non-uniform photonic stimulation.
2. The photovoltaic module according to claim 1, further comprising the at least one DC-DC converter electrically connected to the plurality of cell strings via the plurality of reconfigurable interconnects.
3. The photovoltaic module according to claim 2, wherein the at least one DC-DC converter comprises a plurality of DC-DC converters and the plurality of reconfigurable interconnects comprises at least one switch located between the plurality of DC-DC converters for dynamically selecting, in operation, a number of DC-DC converters to be actively used.
4. The photovoltaic module according to claim 3, wherein the plurality of DC-DC converters comprises at least two DC-DC converters interconnected in a voltage increment configuration or at least two DC-DC converters interconnected in a current accumulation configuration.

5. The photovoltaic module according to claim 4, wherein the plurality of DC-DC converters comprises at least two DC-DC converters interconnected in a parallel configuration or wherein the plurality of DC-DC converters comprises at least two DC-DC converters interconnected in a parallel configuration and a further DC-DC converter, wherein a joined output of the at least two DC-DC converters interconnected in a parallel configuration is connected as input to the further DC-DC converter.
6. The photovoltaic module according to claim 1, further comprising the at least one controller for controlling the plurality of reconfigurable interconnects such as to form, when in operation, parallel, serial, or hybrid connections of the plurality of cell strings to cluster matching photovoltaic cells in response to a non-uniform photonic stimulation by optimizing at least one of current, voltage, frequency, or power provided by the at least one DC/DC converter over the output line.
7. The photovoltaic module according to claim 1, wherein, for some or all cell strings of the plurality of cell strings that interconnects a first subset of photovoltaic cells, a corresponding mirrored cell string exists in the plurality of cell strings that interconnects a second subset of photovoltaic cells, wherein the second subset is obtained by a point mirror projection of the first subset with respect to a geometrical center of the grid.
8. The photovoltaic module according to claim 1, wherein each U-shaped cell string corresponds to a pair of adjacent logical columns and a half with respect to the number of logical rows, such that any photovoltaic cell interconnected by the U-shaped cell string has a column index corresponding to either one of the pair of adjacent logical columns and a row index corresponding to a row in the half.
9. The photovoltaic module according to claim 1, wherein the plurality of cell strings forms a partition of the plurality of photovoltaic cells, and wherein the plurality of cell strings consists of the U-shaped cell strings.
10. The photovoltaic module according to claim 1, wherein the plurality of reconfigurable interconnects comprises at least one first switch having a first terminal electrically connected to a last cell of a corresponding cell string and a second terminal electrically connected to a first cell of another cell string, and wherein the first cell of the another cell string is adjacent to the last cell of the corresponding cell string, or wherein the plurality of reconfigurable interconnects comprises at least one second switch having a first terminal electrically connected to a first cell of a corresponding cell string and a second terminal electrically connected to a last cell of another cell string, and wherein the first cell of the another cell string is adjacent to the last cell of the corresponding cell string.
11. The photovoltaic module according to claim 1, wherein the plurality of reconfigurable interconnects comprises at least one switch having a first terminal electrically connected to a corresponding cell string and a second terminal electrically connectable to the at least one DC-DC converter when in operation.
12. A photovoltaic system, comprising:
a plurality of photovoltaic modules; and
at least one controller for controlling the plurality of photovoltaic modules,
wherein the photovoltaic modules comprise:
a plurality of photovoltaic cells arranged in a grid having logical rows and columns;
a plurality of non-reconfigurable interconnects electrically interconnecting subsets of the plurality of photovoltaic cells to form a plurality of cell strings, wherein the plurality of cell strings comprises:
a first plurality of U-shaped cell strings;
a second plurality of U-shaped cell strings;
a first linear edge cell string; and
a second linear edge cell string; and
a plurality of reconfigurable interconnects,
wherein the plurality of U-shaped cell strings forms a partition of the plurality of photovoltaic cells,
wherein each U-shaped cell string of the first plurality of U-shaped cell strings interconnects only cells located in a first half of rows of the grid,
wherein each U-shaped cell string of the second plurality of U-shaped cell strings interconnects only cells located in a second half of rows of the grid,
wherein the first linear edge cell string interconnects only photovoltaic cells of a first column of the grid,
wherein the second linear edge cell string interconnects only photovoltaic cells of a last column of the grid,
wherein the plurality of reconfigurable interconnects are arranged only on edges of the photovoltaic module,
wherein the plurality of reconfigurable interconnects is adapted for electrically interconnecting the plurality of cell strings such that a global photovoltaic string consisting of an electrical series connecting the plurality of cell strings can be controllably established,
wherein the plurality of reconfigurable interconnects is adapted for controllably connecting adjacent cell strings electrically in parallel, thereby establishing at least one parallel electrical circuit having parallel circuit legs formed by at least two adjacent cell strings,
wherein the photovoltaic module is adapted for connecting the plurality of cell strings to at least one DC-DC converter for providing an output electrical power over an output line, and
wherein the plurality of reconfigurable interconnects is adapted for receiving at least one control signal from the at least one controller for forming, when in operation, parallel, serial, or hybrid connections of the plurality of cell strings to cluster matching photovoltaic cells in response to a non-uniform photonic stimulation.

13. The photovoltaic system according to claim 12, further comprising the at least one DC-DC converter electrically connected to the plurality of cell strings via the plurality of reconfigurable interconnects.

14. The photovoltaic system according to claim 13, wherein the at least one DC-DC converter comprises a plurality of DC-DC converters and the plurality of reconfigurable interconnects comprises at least one switch located between the plurality of DC-DC converters for dynamically selecting, in operation, a number of DC-DC converters to be actively used.

15. The photovoltaic system according to claim 12, wherein the plurality of cell strings comprises U-shaped cell strings.

16. A method for operating a photovoltaic module, the method comprising:
obtaining a photovoltaic module comprising:
a plurality of photovoltaic cells, arranged in a grid having logical rows and columns,
a plurality of reconfigurable interconnects, wherein the plurality of reconfigurable interconnects are arranged only on edges of the photovoltaic module, and
a plurality of non-reconfigurable interconnects electrically interconnecting subsets of the plurality of photovoltaic cells to form a plurality of cell strings, wherein the plurality of cell strings comprises:
a first plurality of U-shaped cell strings,
a second plurality of U-shaped cell strings,
a first linear edge cell string, and
a second linear edge cell string,
wherein the plurality of U-shaped cell strings forms a partition of the plurality of photovoltaic cells,
wherein each U-shaped cell string of the first plurality of U-shaped cell strings interconnects only cells located in a first half of rows of the grid,
wherein each U-shaped cell string of the second plurality of U-shaped cell strings interconnects only cells located in a second half of rows of the grid,
wherein the first linear edge cell string interconnects only photovoltaic cells of a first column of the grid, and
wherein the second linear edge cell string interconnects only photovoltaic cells of a last column of the grid,
determining whether the photovoltaic module is subject to a non-uniform photonic stimulation;
controlling the plurality of reconfigurable interconnects of the photovoltaic module to electrically interconnect the plurality of cell strings such that a global photovoltaic string comprising an electrical series connecting the plurality of cell strings is established and connected to a DC-DC converter when the photovoltaic module is determined to be subject to a substantially uniform photonic stimulation; and
controlling the plurality of reconfigurable interconnects to establish at least one parallel electrical circuit having parallel circuit legs formed by at least two adjacent cell strings such as to cluster matching photovoltaic cell strings when the photovoltaic module is determined to be subject to substantially non-uniform photonic stimulation,
wherein controlling the plurality of reconfigurable interconnects comprises sending at least one control signal from at least one controller to the plurality of reconfigurable interconnects.

17. The method according to claim 16, further comprising:
determining a number of active DC-DC converters to connect in parallel to the plurality of cell strings, wherein the number is determined by taking the determined non-uniform photonic stimulation into account; and
controlling the plurality of reconfigurable interconnects to establish a plurality of parallel electrical circuits, each parallel electrical circuit having parallel circuit legs formed by at least two adjacent cell strings, and to establish an electrical connection of each of the plurality of parallel electrical circuits to a corresponding active DC-DC converter.

* * * * *